(12) United States Patent
Huo et al.

(10) Patent No.: US 12,660,108 B2
(45) Date of Patent: Jun. 16, 2026

(54) ROTATING SHAFT APPARATUS, SUPPORT SYSTEM, AND FOLDABLE-SCREEN DEVICE

(71) Applicant: Honor Device Co., Ltd., Shenzhen (CN)

(72) Inventors: Wenlong Huo, Shenzhen (CN); Jiuliang Gao, Shenzhen (CN); Jinguo Zhu, Shenzhen (CN); Yaolei Zhang, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 154 days.

(21) Appl. No.: 18/700,488

(22) PCT Filed: Apr. 12, 2023

(86) PCT No.: PCT/CN2023/087912
§ 371 (c)(1),
(2) Date: Apr. 11, 2024

(87) PCT Pub. No.: WO2023/246246
PCT Pub. Date: Dec. 28, 2023

(65) Prior Publication Data
US 2024/0414861 A1 Dec. 12, 2024

(30) Foreign Application Priority Data
Jun. 23, 2022 (CN) .......................... 202210720781.6

(51) Int. Cl.
*H05K 5/02* (2006.01)
*F16C 11/04* (2006.01)
(Continued)

(52) U.S. Cl.
CPC ............ *H05K 5/0226* (2013.01); *F16C 11/04* (2013.01); *F16N 1/00* (2013.01); *F16N 15/00* (2013.01)

(58) Field of Classification Search
CPC .... G06F 1/1652; G06F 1/1681; G06F 1/1616; H05K 5/0026; F16C 11/04; F16C 11/12; H04M 1/0216; H04M 1/0268
See application file for complete search history.

(56) References Cited

U.S. PATENT DOCUMENTS 8,348,450 B2 * 1/2013 Hebenstreit ........... G06F 1/1626
362/85
10,015,897 B1 7/2018 Hong et al.
(Continued)

FOREIGN PATENT DOCUMENTS

CN 105830140 A 8/2016
CN 111294434 A 6/2020
(Continued)

*Primary Examiner* — Abhishek M Rathod
(74) *Attorney, Agent, or Firm* — Slater Matsil, LLP

(57) ABSTRACT

This application provides a rotating shaft apparatus and a foldable-screen device. The rotating shaft apparatus includes a first primary support member, a second primary support member, a first secondary support member, and a lubrication structure. The first primary support member has a first support surface, the second primary support member has a second support surface, and the second primary support member can rotate relative to the first primary support member between an unfolded location and a folded location. The first secondary support member includes a first connection part and a first cantilever part, the first connection part is located on a side facing the second support surface and is connected to the second primary support member, the first cantilever part includes a first cantilever segment, and the first cantilever segment is located on a side facing the first support surface.

20 Claims, 14 Drawing Sheets

(51) Int. Cl.
   *F16N 1/00*          (2006.01)
   *F16N 15/00*         (2006.01)

(56)                   References Cited

U.S. PATENT DOCUMENTS

| | | | | |
|---|---|---|---|---|
| 11,627,671 | B2 | 4/2023 | Feng | |
| 11,846,991 | B2 * | 12/2023 | Feng .................... | G06F 1/1637 |
| 12,147,274 | B2 * | 11/2024 | Zhang ................... | H04M 1/022 |
| 12,181,935 | B2 * | 12/2024 | Hsiang ................. | G06F 1/1624 |
| 2017/0115701 | A1 * | 4/2017 | Bae .......................... | G06F 1/16 |
| 2022/0308634 | A1 | 9/2022 | Hou et al. | |
| 2023/0185338 | A1 | 6/2023 | Seo et al. | |
| 2023/0229189 | A1 | 7/2023 | Li et al. | |
| 2024/0211002 | A1 | 6/2024 | Zhang et al. | |
| 2024/0248512 | A1 * | 7/2024 | Tang ...................... | H04M 1/18 |

FOREIGN PATENT DOCUMENTS

| | | | |
|---|---|---|---|
| CN | 111583791 | A | 8/2020 |
| CN | 212484204 | U | 2/2021 |
| CN | 113315860 | A | 8/2021 |
| CN | 113805646 | A | 12/2021 |
| CN | 114251349 | A | 3/2022 |
| CN | 114283697 | A | 4/2022 |
| CN | 114401328 | A | 4/2022 |
| CN | 114449074 | A | 5/2022 |
| CN | 114598765 | A | 6/2022 |
| WO | 2016163852 | A1 | 10/2016 |
| WO | 2022057069 | A1 | 3/2022 |

* cited by examiner

100

23

23

23

23

23

23

23

23

23

23

23

23

23

23

ROTATING SHAFT APPARATUS, SUPPORT SYSTEM, AND FOLDABLE-SCREEN DEVICE

CROSS-REFERENCE TO RELATED APPLICATIONS

This application is a national stage of International Application No. PCT/CN2023/087912, filed on Apr. 12, 2023, which claims priority to Chinese Patent Application No. 202210720781.6, filed on Jun. 23, 2022. The disclosures of both of the aforementioned applications are hereby incorporated by reference in their entireties.

TECHNICAL FIELD

This application relates to the technical field of foldable electronic products, and in particular, to a rotating shaft apparatus, a support system, and a foldable-screen device.

BACKGROUND

Currently, to resolve a problem that conventional tablet devices are large in size and are inconvenient to carry, foldable-screen devices emerge. A support system of the foldable-screen device includes housings on two sides and a rotating shaft apparatus connected between the housings on the two sides. In a process of folding/unfolding an electronic device, the housings on the two sides rotate relative to the rotating shaft apparatus, and parts in the rotating shaft apparatus move relative to and scrape against each other, which easily generates noise, causing relatively low user experience of the foldable-screen device.

SUMMARY

Embodiments of this application provide a rotating shaft apparatus, a support system, and a foldable-screen device, to resolve a problem of how to reduce noise generated by a rotating shaft apparatus in a foldable-screen device in a moving process.

To achieve the foregoing objective, the following technical solutions are used in the embodiments of this application.

According to a first aspect, a rotating shaft apparatus is provided. The rotating shaft apparatus includes a first primary support member, a second primary support member, a first secondary support member, and a lubrication structure. The first primary support member has a first support surface, the second primary support member has a second support surface, and both the first support surface and the second support surface are configured to support a part of a foldable screen. The second primary support member can rotate relative to the first primary support member between an unfolded location and a folded location. The first secondary support member includes a first connection part and a first cantilever part that are fixedly connected. The first connection part is located on a side facing the second support surface and is connected to the second primary support member, the first cantilever part includes a first cantilever segment, the first cantilever segment is located on a side facing the first support surface, and when the second primary support member rotates relative to the first primary support member between the unfolded location and the folded location, at least a part of the first cantilever segment slides relative to the first primary support member. The lubrication structure is disposed at least between at least a part of the first cantilever segment and the first primary support member.

The lubrication structure may be a structure with a smooth surface, to be specific, the lubrication structure may be a type of structure whose surface friction coefficient is less than 0.25. Specifically, the surface friction coefficient of the lubrication structure may be 0.24, 0.23, 0.2, 0.1, 0.05, 0.02, 0.01, or the like. On this basis, a material of the lubrication structure includes but is not limited to a compound including a fluorine element. For example, the material of the lubrication structure is polytetrafluoroethylene. In some other embodiments, the material of the lubrication structure may alternatively be polyoxymethylene (polyoxymethylene, POM). In this way, the surface friction coefficient of the lubrication structure is decreased to reduce noise.

The lubrication structure may alternatively be a soft elastic structure. The material of the lubrication structure includes but is not limited to an elastic material including polyurethane, rubber, latex, or the like. In this way, the lubrication structure reduces noise by avoiding hard contact between two structures that scrape against each other.

In this way, lubrication is performed between the at least a part of the first cantilever segment and the first primary support member by using the lubrication structure, to prevent noise generated due to scraping between the at least a part of the first cantilever segment and the first primary support member, thereby improving user experience of a foldable-screen device.

In a possible implementation of the first aspect, the second primary support member and the first primary support member, and the third primary support member and the first primary support member may be directly rotatably connected by using a rotating shaft, may be rotatably connected by using an intermediate transmission mechanism such as a hinge mechanism or a four-bar mechanism, or may be rotatably connected by using a soft material such as leather or cloth. This is not specifically limited herein.

In a possible implementation of the first aspect, the first secondary support member is in a sheet shape, and when the second primary support member is in an unfolded state relative to the first primary support member, the first secondary support member is stacked with the first support surface and the second support surface. A thickness of the first secondary support member is greater than or equal to 0.02 mm and less than or equal to 0.1 mm. In this way, a thickness of the rotating shaft apparatus can be reduced, which helps thin the foldable-screen device in the unfolded state or the folded state, and can ensure guaranteed structural strength of the first secondary support member.

In a possible implementation of the first aspect, a material of the lubrication structure is a compound including a fluorine element.

In a possible implementation of the first aspect, the material of the lubrication structure is polytetrafluoroethylene or polyoxymethylene.

In a possible implementation of the first aspect, the lubrication structure includes a first lubrication layer. The first lubrication layer is disposed on a surface that is of the at least a part of the first cantilever segment and that faces the first primary support member. The structure is simple, a disposing region of the lubrication structure is relatively small, and costs are relatively low.

In a possible implementation of the first aspect, an end that is of the first cantilever segment and that is away from the first connection part is a first end, and the first end forms an end that is of the first cantilever part and that is away from the first connection part. The lubrication structure further includes a second lubrication layer. The second lubrication layer is disposed on an end surface of the first end. In this way, lubrication can be performed between the first cantilever segment and the first primary support member by using the second lubrication layer, to reduce noise to a specific extent.

In a possible implementation of the first aspect, the lubrication structure further includes a third lubrication layer. The third lubrication layer is disposed on a surface that is of the first cantilever segment and that is away from the first primary support member. In this way, in a process of forming the second lubrication layer by using a process such as spraying, flow coating, electrochemical deposition, or electroplating, the third lubrication layer is also formed. Therefore, a third surface does not need to be covered, and a processing process is simple and is convenient to operate. When the second lubrication layer is disposed on the surface of the first cantilever part through adhesion, the third lubrication layer may be fastened to the third surface through adhesion, and the second lubrication layer and the third lubrication layer may be designed as a whole thin film, to increase a bonding area between the lubrication structure and the first secondary support member, improve bonding strength, and prolong a service life.

In a possible implementation of the first aspect, there is a first gap between the first primary support member and the second primary support member. The first cantilever part further includes a second cantilever segment, and the second cantilever segment is located on a side that is of the first gap and that faces the foldable screen. The lubrication structure is further disposed between the second cantilever segment and the first gap. In this way, lubrication is further performed between the second cantilever segment and a structural member such as a swing arm or a rotating shaft in the first gap by using the lubrication structure, to prevent noise generated due to scraping between the second cantilever segment and the structural member in the first gap, thereby further improving user experience of the foldable-screen device.

In a possible implementation of the first aspect, the rotating shaft apparatus further includes a third primary support member and a second secondary support member. The third primary support member is located on a side that is of the first primary support member and that is away from the second primary support member. The third primary support surface has a third support surface, and the third support surface is also configured to support a part of the foldable screen. The third primary support member can also rotate relative to the first primary support member between the unfolded location and the folded location. The second secondary support member includes a second connection part and a second cantilever part that are fixedly connected. The second connection part is located on a side facing the third support surface and is connected to the third primary support member, the second cantilever part includes a third cantilever segment, the third cantilever segment is located on the side facing the first support surface, and when the third primary support member rotates relative to the first primary support member between the unfolded location and the folded location, at least a part of the third cantilever segment slides relative to the first primary support member. The lubrication structure is further disposed at least between the at least a part of the third cantilever segment and the first primary support member. In this way, lubrication is also performed between the at least a part of the third cantilever segment and the first primary support member by using the lubrication structure, to prevent noise generated due to scraping between the at least a part of the third cantilever segment and the first primary support member, thereby further improving user experience of the foldable-screen device.

In a possible implementation of the first aspect, there is a second gap between the first primary support member and the third primary support member. The second cantilever part further includes a fourth cantilever segment, and the fourth cantilever segment is located on a side that is of the second gap and that faces the foldable screen. The lubrication structure is further disposed between the fourth cantilever segment and the second gap. In this way, lubrication is further performed between the fourth cantilever segment and a structural member such as a swing arm or a rotating shaft in the second gap by using the lubrication structure, to prevent noise generated due to scraping between the fourth cantilever segment and the structural member in the second gap, thereby further improving user experience of the foldable-screen device.

In a possible implementation of the first aspect, the lubrication structure includes a first lubrication film and a second lubrication film. The first lubrication film includes a first fastening segment and a first free segment, the first fastening segment is fastened to a surface that is of the first secondary support member and that faces the first primary support member and the second primary support member, and the first free segment is located on a side that is of the first fastening segment and that is close to the third primary support member. The second lubrication film includes a second fastening segment and a second free segment, the second fastening segment is fastened to a surface that is of the second secondary support member and that faces the first primary support member and the third primary support member, and the second free segment is located on a side that is of the second fastening segment and that is close to the second primary support member. The second free segment is stacked with the first free segment. In this way, the first lubrication film and the second lubrication film are disposed in a staggered manner, to play a lubrication role and reduce noise. In addition, when the second primary support member and the third primary support member rotate relative to the first primary support member between the unfolded location and the folded location, the first lubrication film and the second lubrication film may slide relative to each other, to avoid affecting movement of the first secondary support member and the second secondary support member relatively away from or close to each other.

In a possible implementation of the first aspect, the lubrication structure includes a third lubrication film. The third lubrication film includes a first lubrication film region, a second lubrication film region, and a third lubrication film region. The first lubrication film region is fastened to the surface that is of the first secondary support member and that faces the first primary support member and the second primary support member, the second lubrication film region is fastened to the surface that is of the second secondary support member and that faces the first primary support member and the third primary support member, and the third lubrication film region is connected between the first lubrication film region and the second lubrication film region. The third lubrication film region can be elastically stretched and contracted in a direction that points from the first lubrication film region to the second lubrication film region. In this way, when the second primary support member and the third primary support member rotate from the unfolded location to the folded location, the third lubrication film region is in a stretched state and accumulates elastic force; and when the second primary support member and the third primary support member rotate from the folded location to the unfolded location, the third lubrication film region contracts under the accumulated elastic force. Therefore, when the second primary support member and the third primary support member rotate relative to the first primary support member between the unfolded location and the folded location, the third lubrication film region is elastically stretched and contracted, to avoid affecting movement of the first secondary support member and the second secondary support member relatively away from or close to each other. In addition, the rotating shaft apparatus in this embodiment can use the third lubrication film to lubricate both the first secondary support member and the second secondary support member and reduce noise. Therefore, a composition structure of the rotating shaft apparatus is simple and easy to implement.

In a possible implementation of the first aspect, the lubrication structure may further include a fourth lubrication film and a fifth lubrication film. One end of the fourth lubrication film is fastened to the surface that is of the first secondary support member and that faces the first primary support member and the second primary support member, and the other end is fastened to the first primary support member. The fourth lubrication film can be elastically stretched and contracted from the end fastened to the first secondary support member to the end fastened to the first primary support member. In some embodiments, a specific segment or a whole of the fourth lubrication film is a soft elastic structure. Specifically, a material of the soft elastic structure includes but is not limited to an elastic material that includes polyurethane, rubber, latex, or the like. One end of the fifth lubrication film is fastened to the surface that is of the second secondary support member and that faces the first primary support member and the third primary support member, and the other end is fastened to the first primary support member. The fifth lubrication film can be elastically stretched and contracted from the end fastened to the second secondary support member to the end fastened to the first primary support member. In this way, when the second primary support member and the third primary support member rotate from the unfolded location to the folded location, the fourth lubrication film and the fifth lubrication film are elastically stretched and contracted, to avoid affecting movement of the first secondary support member and the second secondary support member relatively away from or close to each other.

In a possible implementation of the first aspect, the rotating shaft apparatus further includes a third primary support member. The third primary support member is located on a side that is of the first primary support member and that is away from the second primary support member. The third primary support surface has a third support surface, and the third support surface is also configured to support a part of the foldable screen. The third primary support member can also rotate relative to the first primary support member between the unfolded location and the folded location. The first cantilever part further includes a fifth cantilever segment, where the fifth cantilever segment is located on a side that is of the first cantilever segment and that is away from the first connection part, and the fifth cantilever segment is located on a side facing the third support surface. The lubrication structure is further disposed between at least a part of the fifth cantilever segment and the third primary support member. In this way, lubrication is also performed between the at least a part of the fifth cantilever segment and the third primary support member by using the lubrication structure, to prevent noise generated due to scraping between the at least a part of the fifth cantilever segment and the third primary support member, thereby further improving user experience of the foldable-screen device.

In a possible implementation of the first aspect, the lubrication structure includes a fourth lubrication layer. The fourth lubrication layer is disposed on the first support surface. In this way, lubrication may be performed between the first cantilever segment of the first secondary support member and the first primary support member, and between the third cantilever segment of the second secondary support member and the first primary support member by using the fourth lubrication layer, to prevent noise generated due to scraping between the first cantilever segment and the first primary support member and between the third cantilever segment and the first primary support member, thereby improving user experience of the foldable-screen device. In addition, lubrication between the first secondary support member and the first primary support member and lubrication between the second secondary support member and the first primary support member can be implemented simultaneously by using the fourth lubrication layer, which helps reduce structural complexity of the rotating shaft apparatus.

According to a second aspect, a rotating shaft apparatus is further provided. The rotating shaft apparatus includes a first primary support member, a second primary support member, a first secondary support member, and a lubrication structure. The first primary support member has a first support surface, the second primary support member has a second support surface, and both the first support surface and the second support surface are configured to support a part of a foldable screen. The second primary support member can rotate relative to the first primary support member between an unfolded location and a folded location. The first secondary support member includes a first connection part and a first cantilever part that are fixedly connected. The first connection part is located on a side facing the first support surface and is connected to the first primary support member, the first cantilever part includes a first cantilever segment, the first cantilever segment is located on a side facing the second support surface, and when the second primary support member rotates relative to the first primary support member between the unfolded location and the folded location, at least a part of the first cantilever segment slides relative to the second primary support member. The lubrication structure is disposed at least between the at least a part of the first cantilever segment and the second primary support member.

The lubrication structure may be a structure with a smooth surface, to be specific, the lubrication structure may be a type of structure whose surface friction coefficient is less than 0.25. Specifically, the surface friction coefficient of the lubrication structure may be 0.24, 0.23, 0.2, 0.1, 0.05, 0.02, 0.01, or the like. On this basis, a material of the lubrication structure includes but is not limited to a compound including a fluorine element. For example, the material of the lubrication structure is polytetrafluoroethylene. In some other embodiments, the material of the lubrication structure may alternatively be polyoxymethylene (polyoxymethylene, POM). In this way, the surface friction coefficient of the lubrication structure is decreased to reduce noise.

The lubrication structure may alternatively be a soft elastic structure. The material of the lubrication structure includes but is not limited to an elastic material including polyurethane, rubber, latex, or the like. In this way, the lubrication structure reduces noise by avoiding hard contact between two structures that scrape against each other.

In this way, lubrication is performed between the at least a part of the first cantilever segment and the second primary support member by using the lubrication structure, to prevent noise generated due to scraping between the at least a part of the first cantilever segment and the second primary support member, thereby improving user experience of a foldable-screen device.

In a possible implementation of the second aspect, there is a first gap between the first primary support member and the second primary support member. The first cantilever part further includes a second cantilever segment, and the second cantilever segment is located on a side that is of the first gap and that faces the foldable screen. The lubrication structure is further disposed between the second cantilever segment and the first gap. In this way, lubrication is further performed between the second cantilever segment and a structural member such as a swing arm or a rotating shaft in the first gap by using the lubrication structure, to prevent noise generated due to scraping between the second cantilever segment and the structural member in the first gap, thereby further improving user experience of the foldable-screen device.

In a possible implementation of the second aspect, the rotating shaft apparatus further includes a third primary support member and a second secondary support member. The third primary support member is located on a side that is of the first primary support member and that is away from the second primary support member. The third primary support surface has a third support surface, and the third support surface is also configured to support a part of the foldable screen. The third primary support member can also rotate relative to the first primary support member between the unfolded location and the folded location. The second secondary support member includes a second connection part and a second cantilever part that are fixedly connected. The second connection part is located on the side facing the first support surface and is connected to the first primary support member, the second cantilever part includes a third cantilever segment, the third cantilever segment is located on a side facing the third support surface, and when the third primary support member rotates relative to the first primary support member between the unfolded location and the folded location, at least a part of the third cantilever segment slides relative to the third primary support member. The lubrication structure is further disposed at least between the at least a part of the third cantilever segment and the third primary support member.

In this way, lubrication is performed between the at least a part of the third cantilever segment and the third primary support member by using the lubrication structure, to prevent noise generated due to scraping between the at least a part of the third cantilever segment and the third primary support member, thereby further improving user experience of the foldable-screen device.

In a possible implementation of the second aspect, there is a second gap between the first primary support member and the third primary support member. The second cantilever part further includes a fourth cantilever segment, and the fourth cantilever segment is located on a side that is of the second gap and that faces the foldable screen. The lubrication structure is further disposed between the fourth cantilever segment and the second gap. In this way, lubrication is further performed between the fourth cantilever segment and a structural member such as a swing arm or a rotating shaft in the second gap by using the lubrication structure, to prevent noise generated due to scraping between the fourth cantilever segment and the structural member in the second gap, thereby further improving user experience of the foldable-screen device.

According to a third aspect, a support system is further provided. The support system includes a first housing, a second housing, and the rotating shaft apparatus described in any one of the foregoing technical solutions. The rotating shaft apparatus is connected between the first housing and the second housing.

The support system provided in this embodiment of this application includes the rotating shaft apparatus described in any one of the foregoing technical solutions, and therefore the support system and the rotating shaft apparatus can resolve a same problem and achieve a same effect.

According to a fourth aspect, a foldable-screen device is further provided. The foldable-screen device includes a foldable screen and the support system described in the foregoing technical solution. The foldable screen includes a first display region, a second display region, and a third display region, and the third display region is connected between the first display region and the second display region. The first display region is disposed on the first housing, and the second display region is disposed on the second housing. The third display region is disposed on the rotating shaft apparatus.

The foldable-screen device provided in this embodiment of this application includes the support system described in any one of the foregoing technical solutions, and therefore the foldable-screen device and the support system can resolve a same problem and achieve a same effect.

DETAILED DESCRIPTION OF THE EMBODIMENTS

Figure 1:
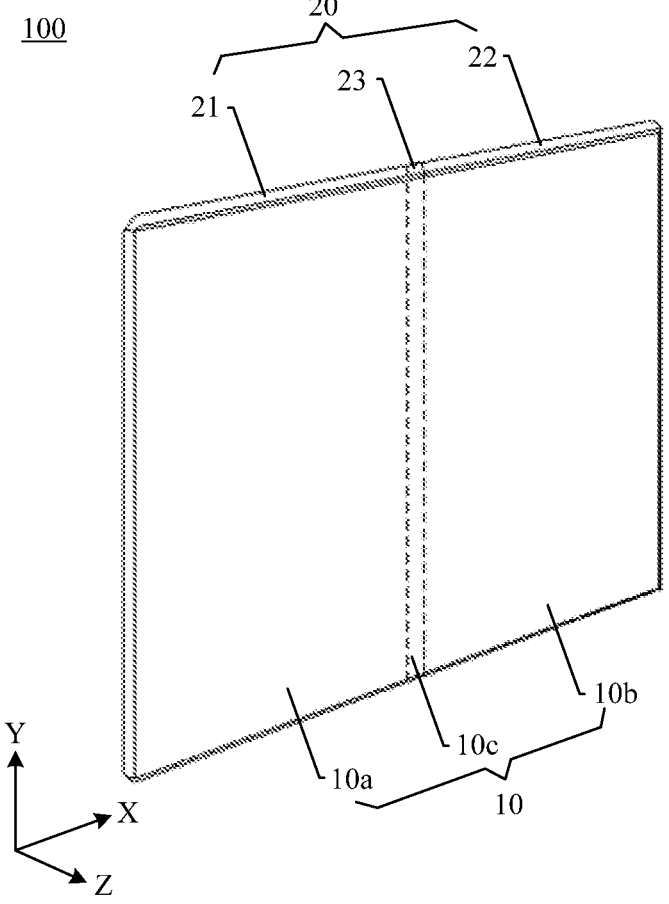
FIG. 1 is a three-dimensional view of a foldable-screen device in an unfolded state according to some embodiments of this application.

In the embodiments of this application, terms "first", "second", "third", "fourth", "fifth", and "sixth" are used for descriptive purposes only, and should not be construed as indicating or implying relative importance or implicitly indicating a quantity of indicated technical features. Therefore, features defined with "first", "second", "third", "fourth", "fifth", and "sixth" may explicitly or implicitly include one or more of the features.

In the embodiments of this application, it should be understood that an orientation relationship or a location relationship indicated by terms "top", "bottom", "left", and "right" are an orientation relationship or a location relationship shown based on the accompanying drawings, and is merely intended to facilitate description of this application and simplify description, but is not intended to indicate or imply that a specified apparatus or element needs to have a specific orientation or be constructed and operated in a specific orientation. Therefore, the terms should not be construed as a limitation on this application.

In the embodiments of this application, the term "include", "comprise", or any other variant thereof is intended to cover non-exclusive inclusion, so that a process, method, article, or apparatus that includes a series of elements not only includes those elements, but also includes other elements that are not explicitly listed, or includes elements inherent to such a process, method, article, or apparatus. Without further limitation, the element defined by the sentence "including a . . . " does not exclude that other identical elements also exist in the process, method, article, or apparatus including the element.

In the embodiments of this application, the term "and/or" is only used to describe an association relationship between associated objects, and indicates that three relationships may exist. For example, "A and/or B" may indicate the following three cases: Only A exists, both A and B exist, and only B exists. In addition, the character "/" in this specification usually indicates an "or" relationship between associated objects.

This application provides a foldable-screen device. The foldable-screen device may be user equipment (user equipment, UE), a terminal device (terminal), or the like. For example, the foldable-screen device may be a mobile terminal or a fixed terminal, such as a tablet computer (portable android device, PAD), personal digital processing (personal digital assistant, PDA), a handheld device with a wireless communication function, a computing device, an in-vehicle device, a wearable device, a virtual reality (virtual reality, VR) terminal device, an augmented reality (augmented reality, AR) terminal device, a wireless terminal in industrial control (industrial control), a wireless terminal in self driving (self driving), a wireless terminal in remote medical (remote medical), a wireless terminal in a smart grid (smart grid), a wireless terminal in transportation safety (transportation safety), a wireless terminal in a smart city (smart city), or a wireless terminal in a smart home (smart home). A form of the foldable-screen device is not specifically limited in the embodiments of this application.

Figure 2:
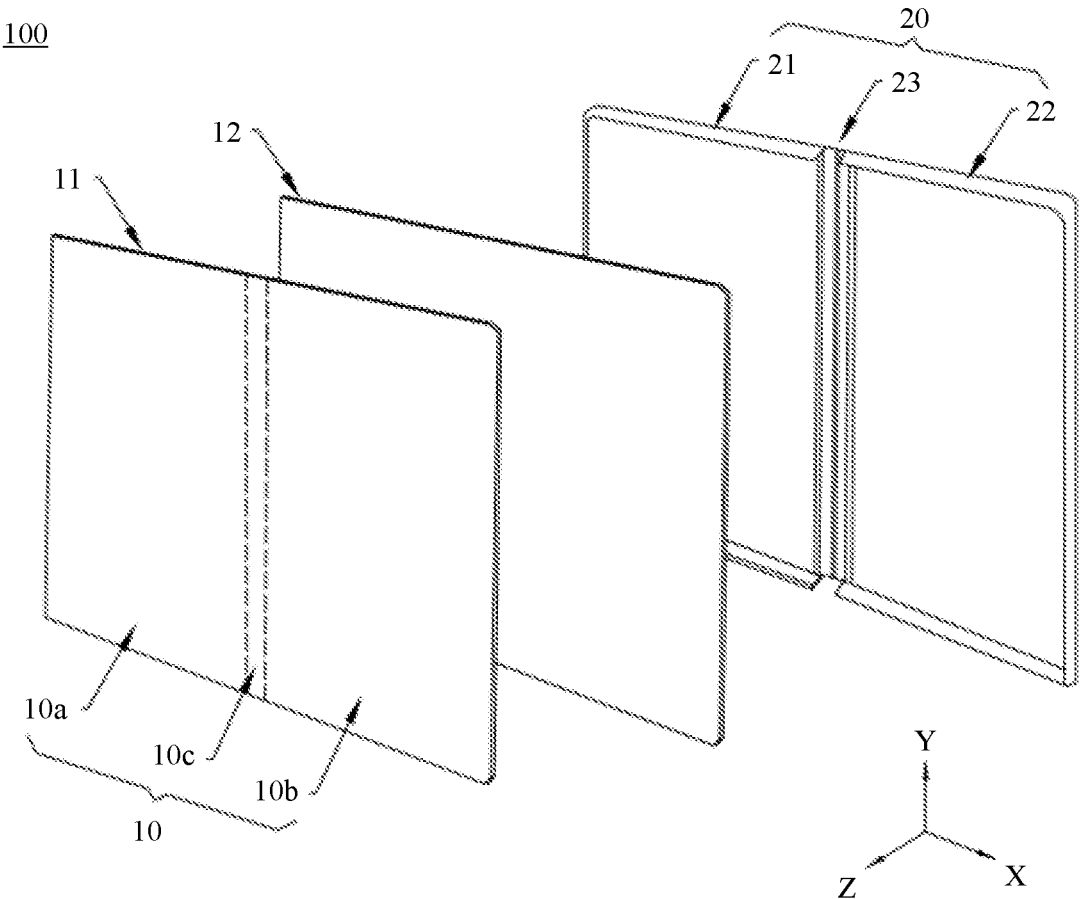
FIG. 2 is a schematic diagram of a partial exploded structure of the foldable-screen device shown in FIG. 1.

Referring to FIG. 1 and FIG. 2, FIG. 1 is a three-dimensional view of a foldable-screen device 100 in an unfolded state according to some embodiments of this application, and FIG. 2 is a schematic diagram of a partial exploded structure of the foldable-screen device 100 shown in FIG. 1. This embodiment and the following embodiments are described by using an example in which the foldable-screen device 100 is a handheld device with a wireless communication function. The handheld device with a wireless communication function may be, for example, a mobile phone. The foldable-screen device 100 is approximately in a shape of a rectangular flat panel in the unfolded state. For ease of description in the following embodiments, an XYZ coordinate system is established for the foldable-screen device 100 in the unfolded state, a length direction of the foldable-screen device 100 is defined as an X-axis direction, a width direction of the foldable-screen device 100 is defined as a Y-axis direction, and a thickness direction of the foldable-screen device 100 is defined as a Z-axis direction. It may be understood that the coordinate system of the foldable-screen device 100 may be flexibly set based on an actual requirement. This is not specifically limited herein. In some other embodiments, the foldable-screen device 100 may alternatively be in a shape of a square flat panel, a shape of a round flat panel, a shape of an elliptical flat panel, or the like.

The foldable-screen device 100 includes a foldable screen 10 and a support system 20.

In some embodiments, referring to FIG. 2, the foldable screen 10 includes a screen body 11 and a support structure 12 that are stacked. The screen body 11 is configured to display information such as an image and a video. Specifically, the screen body 11 may be an organic light-emitting diode (organic light-emitting diode, OLED) screen, a micro organic light-emitting diode (micro organic light-emitting diode) screen, a quantum dot light emitting diode (quantum dot light emitting diodes, QLED) screen, a liquid crystal display (liquid crystal display, LCD), or the like. The screen body 11 has a display surface used to display image information, and the display surface of the screen body 11 is exposed to present information such as an image and a video to a user. The support structure 12 is disposed on a side that is of the screen body 11 and that is away from the display surface, and is stacked with the screen body 11. The support structure 12 is also referred to as a carbon fiber support plate, and is configured to increase structural strength of the foldable screen 10. In addition, the support structure 12 may be folded together with the screen body 11. The support structure 12 may be in a sheet shape, and a material of the support structure 12 includes but is not limited to metal and a composite material that includes a fiber material.

Referring to FIG. 1 and FIG. 2 together, the foldable screen 10 includes a first display region 10a, a second display region 10b, and a third display region 10c. The first display region 10a, the second display region 10b, and the third display region 10c each include a part of the screen body 11 and a part that is of the support structure 12 and that is opposite to the part of the screen body 11. The third display region 10c is connected between the first display region 10a and the second display region 10b. In the foldable-screen device 100 shown in FIG. 1, when the foldable screen 10 is in the unfolded state, the first display region 10a, the third display region 10c, and the second display region 10b are successively arranged in the X-axis direction. In this way, the foldable-screen device 100 is horizontally folded. In some other embodiments, when the foldable screen 10 is in the unfolded state, the first display region 10a, the third display region 10c, and the second display region 10b may be successively arranged in the Y-axis direction. In this way, the foldable-screen device 100 is vertically folded. When the foldable screen 10 is in the unfolded state, large-screen display can be implemented, to provide richer information for the user, and bring better use experience to the user.

At least the third display region 10c of the foldable screen 10 is a flexible screen structure. In this way, the third display region 10c may be bent and deformed under external force, so that the foldable screen 10 is folded from the unfolded state shown in FIG. 1 to a folded state. The first display region 10a and the second display region 10b of the foldable screen 10 each may be a flexible screen structure, or may be a rigid screen structure, or may be a partial flexible screen structure and a partial rigid screen structure. This is not specifically limited herein.

Figure 3:
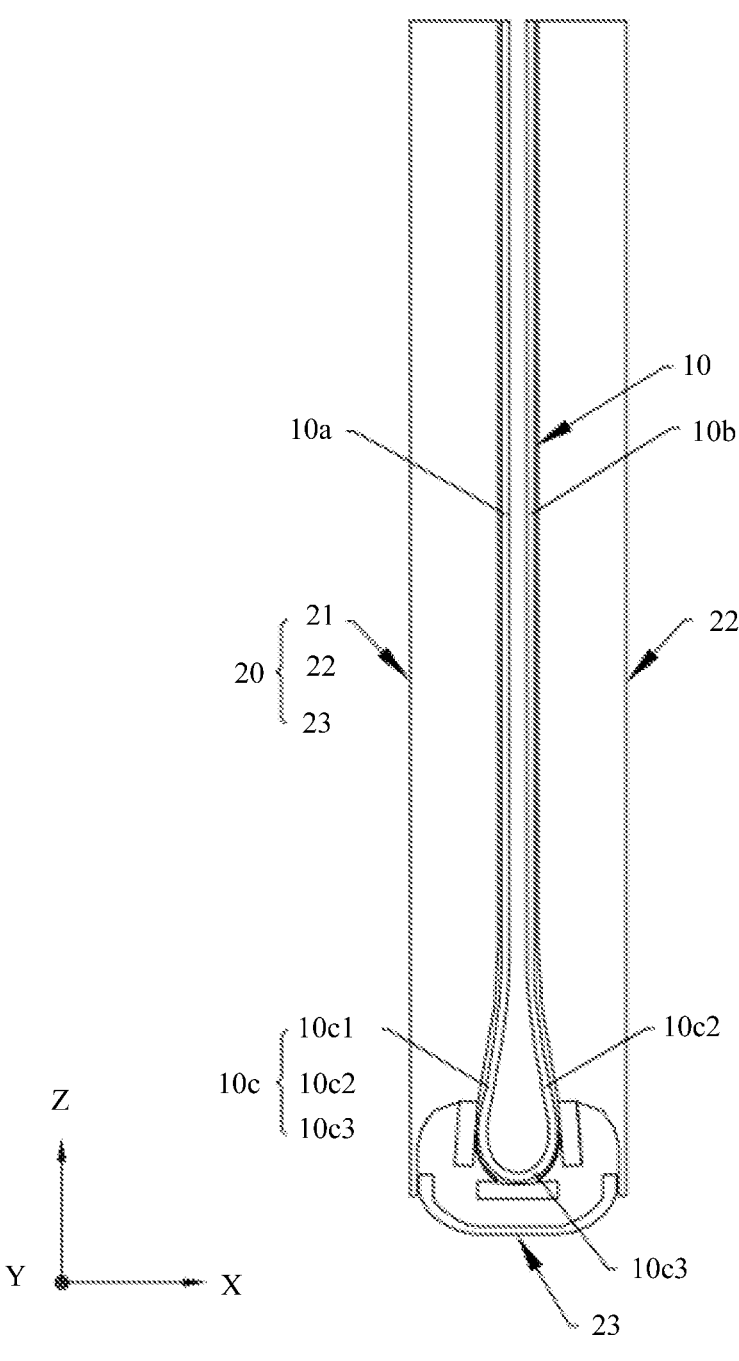
FIG. 3 is a schematic diagram of a structure of the foldable-screen device shown in FIG. 1 in a folded state.

Referring to FIG. 3, FIG. 3 is a schematic diagram of a structure of the foldable-screen device 100 shown in FIG. 1 in a folded state. The foldable screen 10 in the foldable-screen device 100 is also in the folded state. Specifically, when the foldable screen 10 is in the folded state, the first display region 10a and the second display region 10b of the foldable screen 10 are approximately parallel and opposite to each other. It should be noted that, if an included angle between the first display region 10a and the second display region 10b is within 30 degrees) (°, it can be considered that the first display region 10a and the second display region 10b are approximately parallel. That the first display region 10a and the second display region 10b are opposite to each other means that a display surface of the first display region 10a and a display surface of the second display region 10b face each other.

In some embodiments, when the foldable screen 10 is in the folded state, still referring to FIG. 3, the third display region 10c is folded into a water drop form. In this form, the third display region 10c includes an arc segment 10c3 and a first transition segment 10c1 and a second transition segment 10c2 that are located on two opposite sides of the arc segment 10c3. The first transition segment 10c1 is connected between the arc segment 10c3 and the first display region 10a. The second transition segment 10c2 is connected between the arc segment 10c3 and the second display region 10b. A distance between an end that is of the first transition segment 1001 and that is connected to the first display region 10a and an end that is of the second transition segment 10c2 and that is connected to the second display region 10b is a third distance, and a distance between an end that is of the first transition segment 10c1 and that is connected to the arc segment 10c3 and an end that is of the second transition segment 10c2 and that is connected to the arc segment 10c3 is a fourth distance, where the fourth distance is greater than the third distance. It may be understood that, when the foldable-screen device is in the folded state, the third display region 10c of the foldable screen 10 may be folded into another shape based on an actual requirement. This is not limited in this application.

When the foldable-screen device 100 is in the folded state, still referring to FIG. 3, the support system 20 protects the foldable screen 10 from the outside, and the foldable screen 10 is invisible to the user, so that the foldable screen 10 can be prevented from being scratched by a hard object. The foldable-screen device is an inward foldable-screen device, and a size of the foldable-screen device 100 is reduced, so that the foldable-screen device 100 is convenient to carry.

The support system 20 is configured to bear the foldable screen 10. The support system 20 includes a first housing (which may also be referred to as a primary housing) 21, a second housing (which may also be referred to as a secondary housing) 22, and a rotating shaft apparatus 23. The first housing 21 bears the first display region 10a, and the second housing 22 bears the second display region 10b. The rotating shaft apparatus 23 is connected between the first housing 21 and the second housing 22, and bears the third display region 10c. The rotating shaft apparatus 23 is configured to implement rotation between the second housing 22 and the first housing 21, to support folding/unfolding of the foldable screen 10 between the unfolded state and the folded state.

In the foregoing embodiment, optionally, the first housing 21 may include a middle frame and a back cover that are connected together. The first display region 10a of the foldable screen 10 is borne on the middle frame of the first housing 21, the back cover is located on a side that is of the middle frame and that is away from the first display region 10a, and the back cover may be replaced with a display screen (for example, an LCD display screen). An accommodating cavity is formed between the middle frame and the back cover, and the accommodating cavity is configured to accommodate electronic components such as a mainboard, a camera module, and a battery. On this basis, the first housing 21 may be connected to the rotating shaft apparatus 23 by using the middle frame, or may be connected to the rotating shaft apparatus 23 by using the back cover.

Similarly, the second housing 22 may also include a middle frame and a back cover that are connected together. The second display region 10b of the foldable screen 10 is borne on the middle frame of the second housing 22, the back cover is located on a side that is of the middle frame and that is away from the second display region 10b, and the back cover may also be replaced with a display screen (for example, an LCD display screen). An accommodating cavity is formed between the middle frame and the back cover, and the accommodating cavity is configured to accommodate electronic components such as a sub-board, a loudspeaker module, an element, and a battery. On this basis, the second housing 22 may be connected to the rotating shaft apparatus 23 by using the middle frame, or may be connected to the rotating shaft apparatus 23 by using the back cover.

Figure 4:
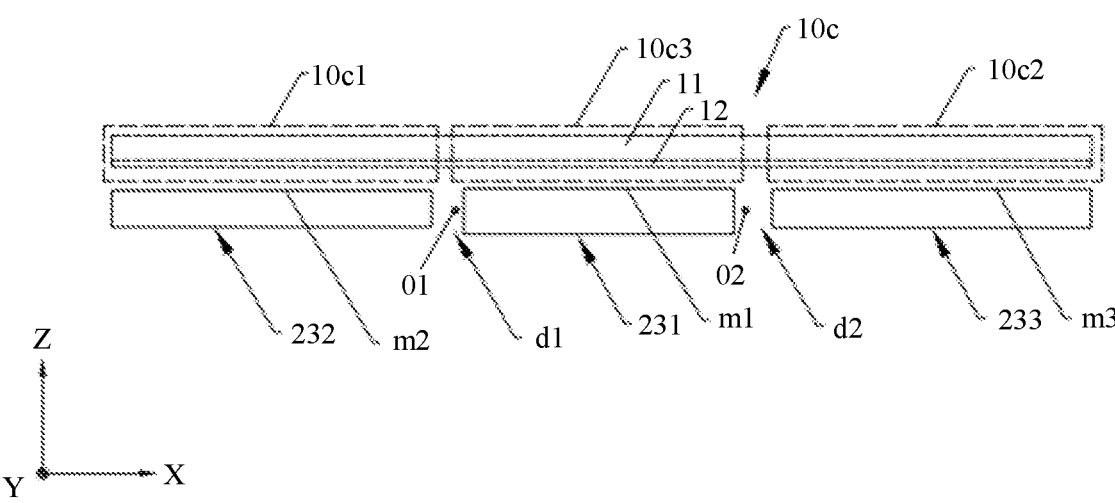
FIG. 4 is a schematic diagram of a structure of a rotating shaft apparatus according to some embodiments of this application.

Referring to FIG. 4, FIG. 4 is a schematic diagram of a structure of a rotating shaft apparatus 23 according to some embodiments of this application. The rotating shaft apparatus 23 includes a first primary support member 231, a second primary support member 232, and a third primary support member 233.

Materials of the first primary support member 231, the second primary support member 232, and the third primary support member 233 include but are not limited to plastic and metal. The first primary support member 231, the second primary support member 232, and the third primary support member 233 each may be in a plate shape, or may be in a block shape. This is not specifically limited herein.

It may be understood that, FIG. 4 shows only some example components included in the rotating shaft apparatus 23, and actual shapes, actual sizes, actual locations, and actual structures of these components are not limited by FIG. 4. In some other examples, the rotating shaft apparatus 23 may further include structures such as a base, a shaft cover, and a swing arm.

The first primary support member 231 is configured to bear a part of the foldable screen 10. Specifically, the first primary support member 231 is configured to bear the arc segment 10c3 of the third display region 10c.

The second primary support member 232 and the third primary support member 233 are respectively located on two opposite sides of the first primary support member 231. The second primary support member 232 and the third primary support member 233 are also configured to bear a part of the foldable screen 10. Specifically, the second primary support member 232 is configured to bear the first transition segment 10c1 of the third display region 10c, and the third primary support member 233 is configured to bear the second transition segment 10c2 of the third display region 10c. Both the second primary support member 232 and the third primary support member 233 can rotate relative to the first primary support member 231 between an unfolded location and a folded location, to support folding/unfolding of the third display region 10c between the unfolded state and the folded state.

Specifically, the first primary support member 231 has a first support surface m1, and the first primary support member 231 supports the arc segment 10c3 by using the first support surface m1; the second primary support member 232 has a second support surface m2, and the second primary support member 232 supports the first transition segment 10c1 by using the second support surface m2; and the third primary support member 233 has a third support surface m3, and the third primary support member 233 supports the second transition segment 10c2 by using the third support surface m3. The rotating shaft apparatus 23 shown in FIG. 4 is in the unfolded state. In this state, the second primary support member 232 and the third primary support member 233 are at the unfolded location, and the first support surface m1, the second support surface m2, and the third support surface m3 are approximately coplanar, to be specific, an included angle between the first support surface m1 and the second support surface m2 is approximately 180°, and an included angle between the first support surface m1 and the third support surface m3 is also approximately 180°, so that the third display region 10c supported on the surfaces is in the unfolded state. When the rotating shaft apparatus 23 is in the unfolded state, the support system 20 including the rotating shaft apparatus 23 and the foldable-screen device including the support system 20 are also in the unfolded state, and an included angle between the first housing 21 and the second housing 22 and the included angle between the first display region 10a and the second display region 10b are also approximately 180°.

Figure 5:
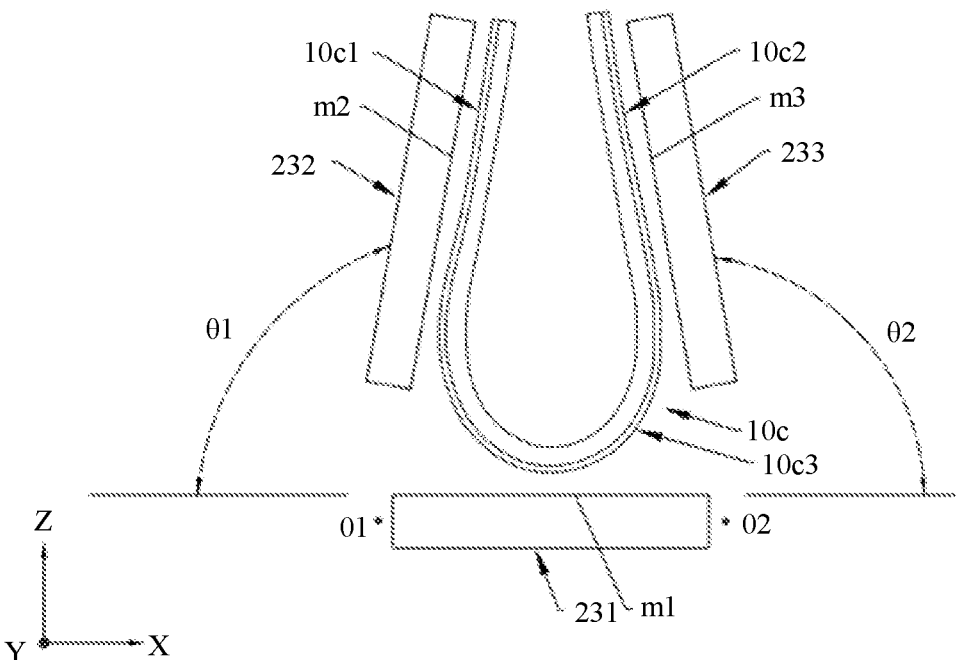
FIG. 5 is a schematic diagram of a structure of the rotating shaft apparatus shown in FIG. 4 in a folded state.

Referring to FIG. 5, FIG. 5 is a schematic diagram of a structure of the rotating shaft apparatus 23 shown in FIG. 4 in a folded state. In this state, the second primary support member 232 and the third primary support member 233 are at the folded location, the second support surface m2 is disposed opposite to the third support surface m3, and the second support surface m2 and the third support surface m3 are disposed obliquely or perpendicular to the first support surface m1, so that the third display region 10c supported on the surfaces is in the folded state. When the rotating shaft apparatus 23 is in the folded state, the support system 20 including the rotating shaft apparatus 23 and the foldable-screen device including the support system 20 are also in the folded state, and the included angle between the first housing 21 and the second housing 22 and the included angle between the first display region 10a and the second display region 10b are also approximately 0°.

In some embodiments, angles rotated by the second primary support member 232 and the third primary support member 233 from the unfolded location to the folded location are respectively θ1 and θ2. In the embodiment shown in FIG. 5, the rotation angles θ1 and θ2 are both greater than 90°. In this way, the third display region 10c may be folded into a water drop shape. In some other embodiments, the rotation angles θ1 and θ2 may alternatively be less than or equal to 90°, to fold the third display region 10c into another shape. This is not specifically limited in this application.

The second primary support member 232 and the first primary support member 231, and the third primary support member 233 and the first primary support member 231 may be directly rotatably connected by using a rotating shaft, may be rotatably connected by using an intermediate transmission mechanism such as a hinge mechanism or a four-bar mechanism, or may be rotatably connected by using a soft material such as leather or cloth. This is not specifically limited herein.

It is assumed that a rotation axis of the second primary support member 232 relative to the first primary support member 231 is a first axis o1, and that a rotation axis of the third primary support member 233 relative to the first primary support member 231 is a second axis o2.

In some embodiments, referring to FIG. 4 and FIG. 5, the second primary support member 232 further moves in a direction close to or away from the first axis o1 in a process of rotating around the first axis o1 between the unfolded location and the folded location. For example, when rotating around the first axis o1 from the unfolded location to the folded location, the second primary support member 232 further moves in a direction away from the first axis o1; and when rotating around the first axis o1 from the folded location to the unfolded location, the second primary support member 232 further moves in a direction close to the first axis o1. Similarly, the third primary support member 233 further moves in a direction close to or away from the second axis o2 in a process of rotating around the second axis o2 between the unfolded location and the folded location. For example, when rotating around the second axis o2 from the unfolded location to the folded location, the third primary support member 233 further moves in a direction away from the second axis o2; and when rotating around the second axis o2 from the folded location to the unfolded location, the third primary support member 233 further moves in a direction close to the second axis o2. In this way, when the second primary support member 232 and the third primary support member 233 rotate from the unfolded location to the folded location, a location of the first primary support member 231 may be lowered by a specific height relative to the first housing and the second housing to avoid the third display region 10c, to reduce a probability that the third display region 10c is damaged due to folding.

In some other embodiments, a distance between the second primary support member 232 and the first axis o1 may remain unchanged in a process of rotating around the first axis o1 between the unfolded location and the folded location. Similarly, a distance between the third primary support member 233 and the second axis o2 may remain unchanged in a process of rotating around the second axis o2 between the unfolded location and the folded location. This is not specifically limited herein.

In some embodiments, when the second primary support member 232 and the third primary support member 233 rotate between the unfolded location and the folded location, referring to FIG. 4 and FIG. 5, the location of the first primary support member 231 may be fixed relative to the first axis o1 and the second axis o2. This structure is simple and easy to implement.

In some other embodiments, when the second primary support member 232 and the third primary support member 233 rotate between the unfolded location and the folded location, the first primary support member 231 may be raised and lowered along a Z axis relative to the first axis o1 and the second axis o2. For example, when the second primary support member 232 and the third primary support member 233 rotate from the unfolded location to the folded location, the first primary support member 231 is lowered along the Z axis relative to the first axis o1 and the second axis o2; and when the second primary support member 232 and the third primary support member 233 rotate from the folded location to the unfolded location, the first primary support member 231 is raised along the Z axis relative to the first axis o1 and the second axis o2. This is not specifically limited in this application, provided that the second primary support member 232 and the third primary support member 233 can rotate relative to the first primary support member 231.

In some embodiments, referring to FIG. 4, there is a first gap d1 between the first primary support member 231 and the second primary support member 232, and there is a second gap d2 between the first primary support member 231 and the third primary support member 233. In this way, a specific gap is reserved between the first primary support member 231 and the second primary support member 232, and between the first primary support member 231 and the third primary support member 233, to prevent mutual collision, friction, or even sticking generated between the second primary support member 232 and the first primary support member 231, and between the third primary support member 233 and the first primary support member 231 when the second primary support member 232 and the third primary support member 233 rotate between the unfolded location and the folded location.

The gap part in the foregoing embodiment cannot effectively support the foldable screen 10. When the user presses a part that is of the foldable screen 10 and that is opposite to the gap, the foldable screen 10 is prone to be bent and deformed, and the foldable-screen device is at a high risk of being damaged and faulty.

Figure 6:
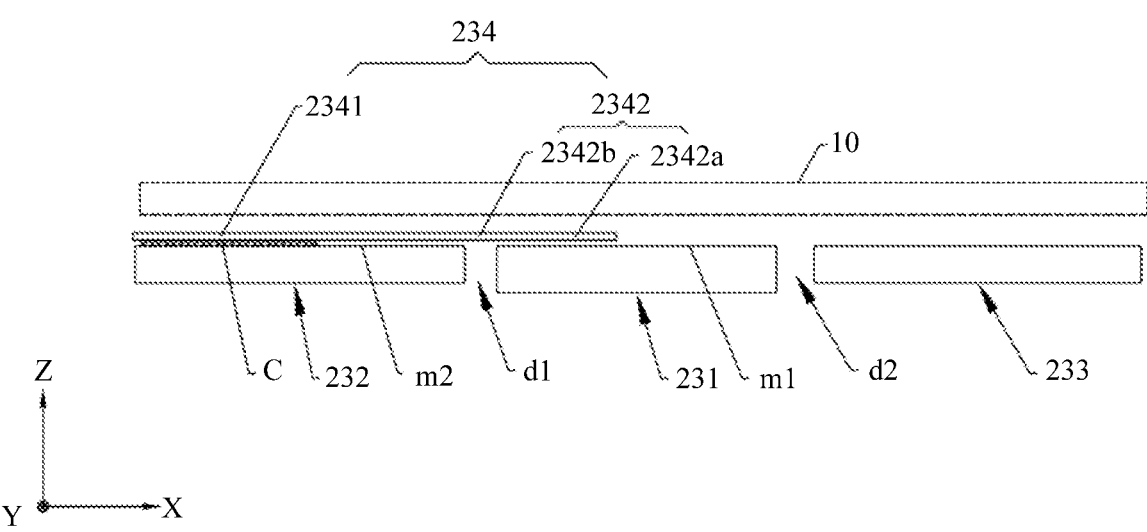
FIG. 6 is a schematic diagram of a structure of a rotating shaft apparatus according to some other embodiments of this application.

To avoid the foregoing problem, referring to FIG. 6, FIG. 6 is a schematic diagram of a structure of a rotating shaft apparatus 23 according to some other embodiments of this application. In this embodiment, in addition to the first primary support member 231, the second primary support member 232, and the third primary support member 233, the rotating shaft apparatus 23 further includes a first secondary support member 234.

In some embodiments, the first secondary support member 234 is in a sheet shape as a whole. On this basis, optionally, when the rotating shaft apparatus 23 is in the unfolded state, the first secondary support member 234 is stacked on the first support surface m1 of the first primary support member 231 and the second support surface m2 of the second primary support member 232, that is, the first secondary support member 234 is approximately parallel to the first support surface m1 and the second support surface m2. In this way, a thickness of the rotating shaft apparatus 23 in the Z-axis direction can be reduced, which helps thin the foldable-screen device 100 in the unfolded state or the folded state.

On the basis of the foregoing embodiment, optionally, a thickness of the first secondary support member 234 may be greater than or equal to 0.02 millimeters (mm) and less than or equal to 0.10 mm. Specifically, the thickness of the first secondary support member 234 may be 0.02 mm, 0.03 mm, 0.04 mm, 0.05 mm, 0.06 mm, 0.07 mm, 0.08 mm, 0.09 mm, or 0.1 mm. In this way, the thickness of the first secondary support member 234 is moderate, so that the thickness of the rotating shaft apparatus 23 in the Z-axis direction can be taken into consideration while structural strength is ensured, thereby helping thin the foldable-screen device 100 in the unfolded state or the folded state.

In some other embodiments, the first secondary support member 234 may alternatively be in a plate shape, a block shape, a strip shape, or the like. This is not specifically limited herein.

In some embodiments, the first secondary support member 234 may be elastic. In this way, when the second primary support member 232 rotates relative to the first primary support member 231 between the unfolded location and the folded location, the first secondary support member 234 may be bent together with the foldable screen 10, thereby avoiding affecting a bending effect of the foldable screen 10.

In some embodiments, a material of the first secondary support member 234 includes but is not limited to metal such as steel or a titanium alloy, and a composite material including a fiber material such as a glass fiber, a carbon fiber, an aramid fiber. The steel is an iron-carbon alloy with a carbon content percentage ranging from 0.02% to 2.11%. Structural strength of these materials is relatively good, which helps reduce the thickness of the first secondary support member 234 while ensuring support strength of the first secondary support member 234, thereby helping thin the foldable-screen device 100. In addition, these materials are elastic-plastic materials. When the first secondary support member 234 is in a sheet shape, the first secondary support member 234 is elastic, and the first secondary support member 234 can be bent together with the foldable screen 10.

Still referring to FIG. 6, the first secondary support member 234 includes a first connection part 2341 and a first cantilever part 2342 that are fixedly connected. The first connection part 2341 is located on a front side of the second primary support member 232, that is, the first connection part 2341 is located on a side that is of the second primary support member 232 and that faces the second support surface m2, and an orthographic projection of the first connection part 2341 on the second support surface m2 is located within the second support surface m2.

On the basis of the foregoing description, in some embodiments, the first connection part 2341 is connected to the second primary support member 232. Optionally, referring to FIG. 6, the first connection part 2341 may be fixedly connected to the second primary support member 232 by using an adhesive C. In some other embodiments, the first connection part 2341 may alternatively be fixedly connected to the second primary support member 232 by using a structure such as a screw or a buckle, or may be rotatably connected to the second primary support member 232 by using a rotating shaft or a flexible structure. This is not specifically limited herein.

The first connection part 2341 may be directly connected to the second primary support member 232, or may be connected to another structure that is relatively fastened to the second primary support member 232. This is not specifically limited herein.

The first cantilever part 2342 is in a cantilever shape. The first cantilever part 2342 includes a first cantilever segment 2342a. The first cantilever segment 2342a is a part, of the first cantilever part 2342, that is located on a side facing the first support surface m1 and whose orthographic projection on the first support surface m1 is located in the first support surface m1 when the rotating shaft apparatus 23 is in an unfolded state.

In this way, the first secondary support member 234 spans the first gap d1, and at least a part of the first secondary support member 234 covers the first gap d1. Specifically, the first cantilever part 2342 may further include a second cantilever segment 2342b. The second cantilever segment 2342b is located between the first connection part 2341 and the first cantilever segment 2342a. The second cantilever segment 2342b is a part, of the first cantilever part 2342, that is located on a side that is of the first gap d1 and that faces the foldable screen 10 and whose projection in the first gap d1 in the Z-axis direction is located in the first gap d1 when the rotating shaft apparatus 23 is in the unfolded state. In this way, the second cantilever segment 2342b covers the first gap d1. When the rotating shaft apparatus 23 is applied to the foldable-screen device 100, the foldable screen 10 is located on a side that is of the first secondary support member 234 and that is away from the first primary support member 231 and the second primary support member 232. The rotating shaft apparatus 23 supports, by using the second cantilever segment 2342b of the first secondary support member 234, a part that is of the foldable screen 10 and that is opposite to the first gap d1, thereby improving support performance of the rotating shaft apparatus 23.

Figure 7:
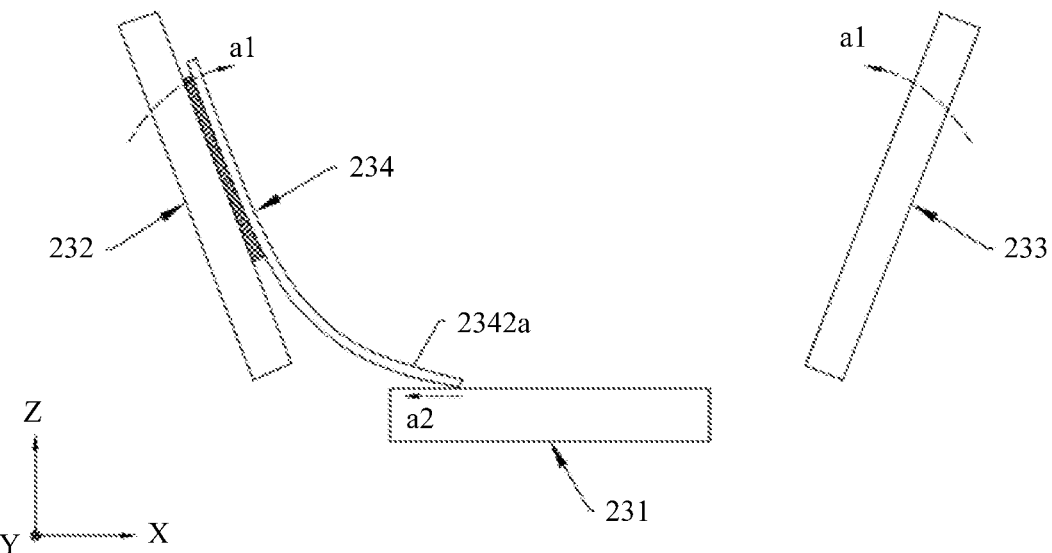
FIG. 7 is a schematic diagram of a structure generated when a second primary support member in the rotating shaft apparatus shown in FIG. 6 rotates relative to a first primary support member from an unfolded location to a folded location in a direction a1.

However, in the rotating shaft apparatus 23 in the foregoing embodiment, when the second primary support member 232 rotates relative to the first primary support member 231 between the unfolded location and the folded location, a whole or a part of the first cantilever segment 2342a (that is, at least a part of the first cantilever segment 2342a) is in contact with the first primary support member 231 and slides relative to the first primary support member 231. For example, referring to FIG. 7, FIG. 7 is a schematic diagram of a structure in which the second primary support member 232 rotates relative to the first primary support member 231 in the rotating shaft apparatus 23 shown in FIG. 6 from an unfolded location to a folded location in a direction a1. The whole of the first cantilever segment 2342a is in contact with the first primary support member 231 and slides leftward relative to the first primary support member 231 in a direction a2. In this way, scraping is generated between the whole of the first cantilever segment 2342a and the first primary support member 231, and noise is generated, causing relatively low user experience of the foldable-screen device.

Figure 8:
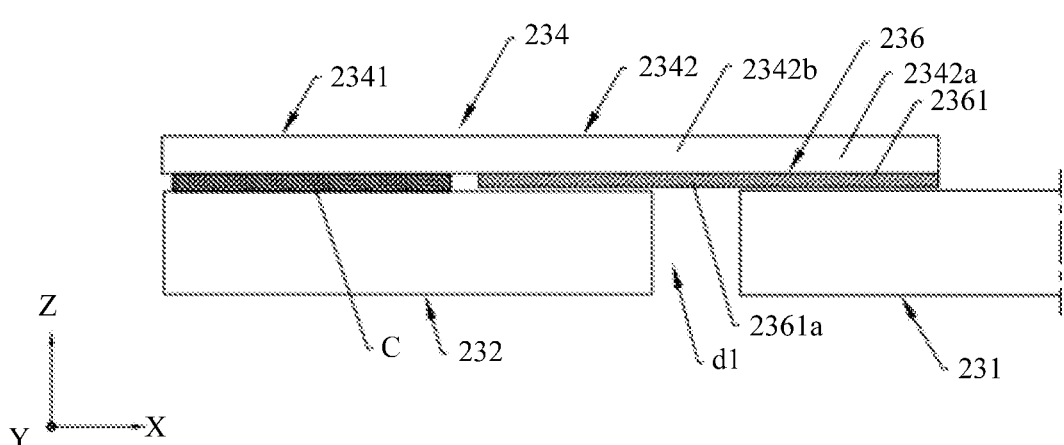
FIG. 8 is a schematic diagram of a structure of a rotating shaft apparatus according to some other embodiments of this application.

To reduce noise of the foldable-screen device, in some embodiments, referring to FIG. 8, FIG. 8 is a schematic diagram of a structure of a rotating shaft apparatus 23 according to some other embodiments of this application. In this embodiment, in addition to the first primary support member 231, the second primary support member 232, the third primary support member 233, and the first secondary support member 234, the rotating shaft apparatus 23 further includes a lubrication structure 236.

The lubrication structure 236 is disposed at least between the at least a part of the first cantilever segment 2342a and the first primary support member 231.

The lubrication structure 236 may be a structure with a smooth surface, to be specific, the lubrication structure 236 may be a type of structure whose surface friction coefficient is less than 0.25. Specifically, the surface friction coefficient of the lubrication structure 236 may be 0.24, 0.23, 0.2, 0.1, 0.05, 0.02, 0.01, or the like. On this basis, a material of the lubrication structure 236 includes but is not limited to a compound including a fluorine element. For example, the material of the lubrication structure 236 is polytetrafluoroethylene. In some other embodiments, the material of the lubrication structure 236 may alternatively be polyoxymethylene (polyoxymethylene, POM). In this way, the surface friction coefficient of the lubrication structure 236 is decreased to reduce noise.

The lubrication structure 236 may alternatively be a soft elastic structure. The material of the lubrication structure 236 includes but is not limited to an elastic material including polyurethane, rubber, latex, or the like. In this way, the lubrication structure 236 reduces noise by avoiding hard contact between two structures that scrape against each other.

In this way, lubrication is performed between the at least a part of the first cantilever segment 2342a and the first primary support member 231 by using the lubrication structure 236, to prevent noise generated due to scraping between the at least a part of the first cantilever segment 2342a and the first primary support member 231, thereby improving user experience of the foldable-screen device.

The lubrication structure 236 is in a plurality of structural forms. In some embodiments, still referring to FIG. 8, the lubrication structure 236 includes a first lubrication layer 2361. The first lubrication layer 2361 is disposed on a surface that is of the at least a part of the first cantilever segment 2342a and that faces the first primary support member 231. It is assumed that a surface that is of the first cantilever segment 2342a and that faces the first primary support member 231 is a first surface, and that the surface that is of the at least a part of the first cantilever segment 2342a and that faces the first primary support member 231 is a first region on the first surface. Specifically, the first lubrication layer 2361 may be disposed in an entire region of the first region, or may be disposed in a partial region of the first region. This is not limited in this application. In addition, the first lubrication layer 2361 may be further disposed in another region on the first surface in addition to being disposed in the first region on the first surface. FIG. 8 provides an example in which the first lubrication layer 2361 is disposed in the entire region on the first surface, but this cannot be considered as a special limitation constituted on this application. The structure is simple, a disposing region of the lubrication structure 236 is relatively small, and costs are relatively low.

Figure 9:
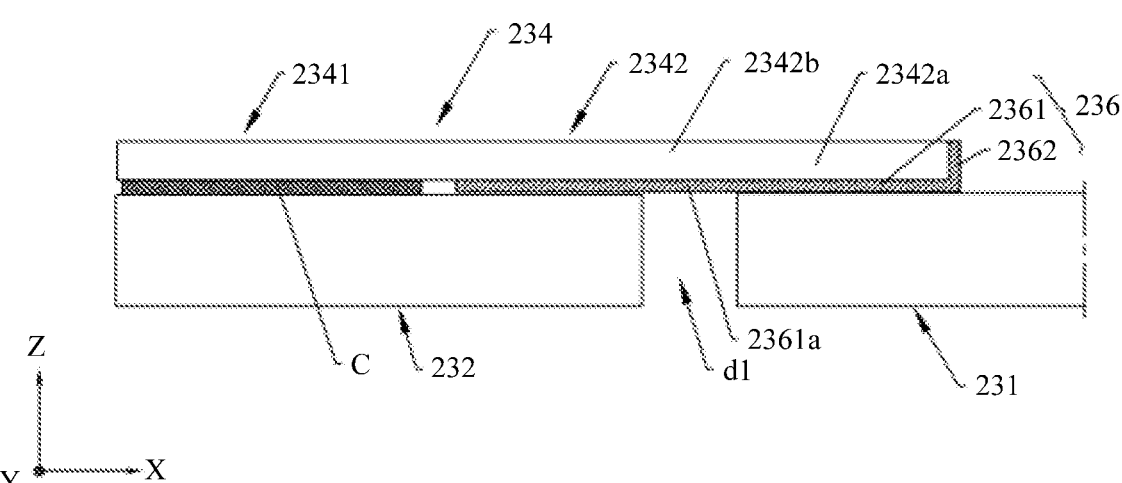
FIG. 9 is a schematic diagram of a structure of a rotating shaft apparatus according to some other embodiments of this application.

In some other embodiments, referring to FIG. 9, FIG. 9 is a schematic diagram of a structure of a rotating shaft apparatus 23 according to some other embodiments of this application. In this embodiment, an end that is of the first cantilever segment 2342a and that is away from the first connection part 2341 is a first end, and the first end forms an end (also referred to as a cantilever end) that is of the first cantilever part 2342 and that is away from the first connection part 2341. On this basis, the lubrication structure 236 further includes a second lubrication layer 2362. The second lubrication layer 2362 is disposed on an end surface of the first end. It is assumed that the end surface of the first end is a second surface. The second lubrication layer 2362 may be disposed in a partial region on the second surface, or may be disposed in an entire region on the second surface. FIG. 9 shows an example in which the second lubrication layer 2362 is disposed in the entire region on the second surface. In this way, lubrication can be performed between the first cantilever segment 2342a and the first primary support member 231 by using the second lubrication layer 2362, to reduce noise to a specific extent.

In the foregoing embodiment, referring to FIG. 9, the lubrication structure 236 may include both the first lubrication layer 2361 and the second lubrication layer 2362, so that a lubrication effect can be improved to further reduce noise. In some other embodiments, the lubrication structure 236 may alternatively include the second lubrication layer 2362, but not include the first lubrication layer 2361. This is not specifically limited herein.

When the lubrication structure 236 includes both the first lubrication layer 2361 and the second lubrication layer 2362, the second lubrication layer 2362 may be in contact with the first lubrication layer 2361, or may not be in contact with the first lubrication layer 2361. This is not specifically limited herein.

In some embodiments, the first lubrication layer 2361 and the second lubrication layer 2362 may be in direct contact with a surface of the first cantilever part 2342. Specifically, the first lubrication layer 2361 and the second lubrication layer 2362 may be formed on the surface of the first cantilever part 2342 by using a process such as spraying, flow coating, electrochemical deposition, or electroplating. This is not specifically limited herein.

In some other embodiments, both the first lubrication layer 2361 and the second lubrication layer 2362 are thin film structures. An adhesive is disposed between the first lubrication layer 2361 and the surface of the first cantilever part 2342, and between the second lubrication layer 2362 and the surface of the first cantilever part 2342. The first lubrication layer 2361 and the second lubrication layer 2362 are bonded to the surface of the first cantilever part 2342 by using the adhesive. This is not specifically limited herein.

Figure 10:
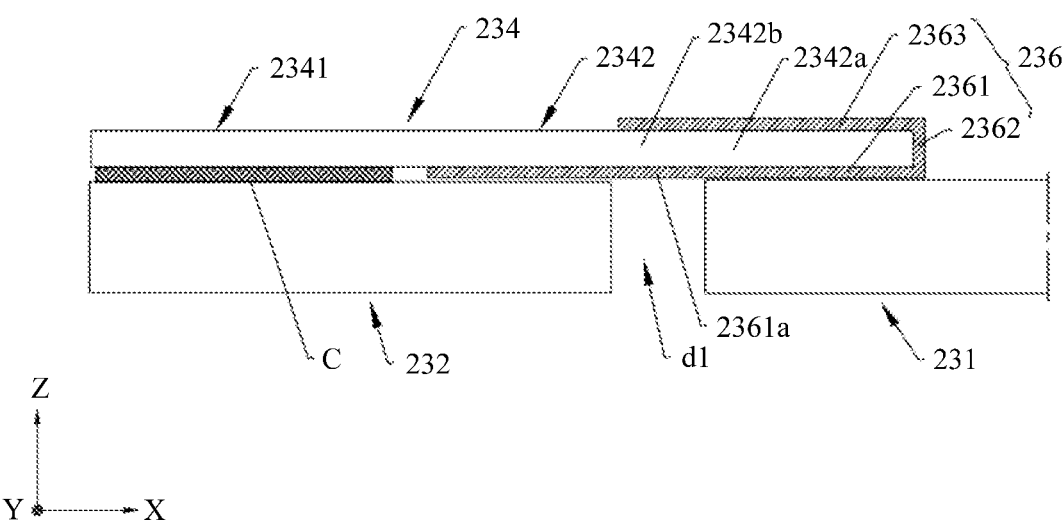
FIG. 10 is a schematic diagram of a structure of a rotating shaft apparatus according to some other embodiments of this application.

In some other embodiments, referring to FIG. 10, FIG. 10 is a schematic diagram of a structure of a rotating shaft apparatus 23 according to some other embodiments of this application. In this embodiment, in addition to the second lubrication layer 2362, the lubrication structure 236 further includes a third lubrication layer 2363. The third lubrication layer 2363 is disposed on a surface that is of the first cantilever segment 2342a and that is away from the first primary support member 231. It is assumed that the surface that is of the first cantilever segment 2342a and that is away from the first primary support member 231 is a third surface. Specifically, the third lubrication layer 2363 may be disposed in an entire region on the third surface, or may be disposed in a partial region on the third surface. FIG. 10 shows an example in which the third lubrication layer 2363 is disposed in the entire region on the third surface, but this cannot be considered as a special limitation constituted on this application.

In this way, in a process of forming the second lubrication layer 2362 by using a process such as spraying, flow coating, electrochemical deposition, or electroplating, the third lubrication layer 2363 is also formed. Therefore, the third surface does not need to be covered, and a processing process is simple and is convenient to operate. When the second lubrication layer 2362 is disposed on the surface of the first cantilever part 2342 through adhesion, the third lubrication layer 2363 may be fastened to the third surface through adhesion, and the second lubrication layer 2362 and the third lubrication layer 2363 may be designed as a whole thin film, to increase a bonding area between the lubrication structure 236 and the first secondary support member 234, improve bonding strength, and prolong a service life.

A structural member such as a swing arm or a rotating shaft may exist in the first gap d1. In this way, when the second primary support member 232 rotates relative to the first primary support member 231 between the unfolded location and the folded location, the second cantilever segment 2342b also slides relative to the structural member such as the swing arm or the rotating shaft in the first gap d1, and consequently noise may also be generated.

To resolve the foregoing problem, in some embodiments, referring to FIG. 8, FIG. 9, or FIG. 10, the lubrication structure 236 may be further disposed between the second cantilever segment 2342b and the first gap d1. For example, referring to FIG. 8, FIG. 9, or FIG. 10, the first lubrication layer 2361 has an extension part 2361a. The extension part 2361a is located on a surface that is of the second cantilever segment 2342b and that faces the first gap d1, and the extension part 2361a forms a part of the lubrication structure 236 between the second cantilever segment 2342b and the first gap d1. Certainly, the part of the lubrication structure 236 between the second cantilever segment 2342b and the first gap d1 may alternatively be in another structural form. This is not specifically limited herein.

In this way, lubrication is further performed between the second cantilever segment 2342b and a structural member such as a swing arm or a rotating shaft in the first gap d1 by using the lubrication structure 236, to prevent noise generated due to scraping between the second cantilever segment 2342b and the structural member in the first gap d1, thereby further improving user experience of the foldable-screen device.

It should be noted that, in addition to being disposed between the first cantilever segment 2342a and the first primary support member 231, and between the second cantilever segment 2342b and the first gap d1, the lubrication structure 236 may be further disposed at another location, for example, disposed on a part (as shown in FIG. 8, FIG. 9, or FIG. 10) that is of the first cantilever part 2342 and that is opposite to the second primary support member 232, or disposed on the first connection part 2341. This is not specifically limited herein.

On the basis of the foregoing description, referring back to FIG. 6, to improve support performance of the rotating shaft apparatus 23 in the second gap d2, in some embodiments, another secondary support member may be disposed on a front side of the second gap d2.

Figure 11:
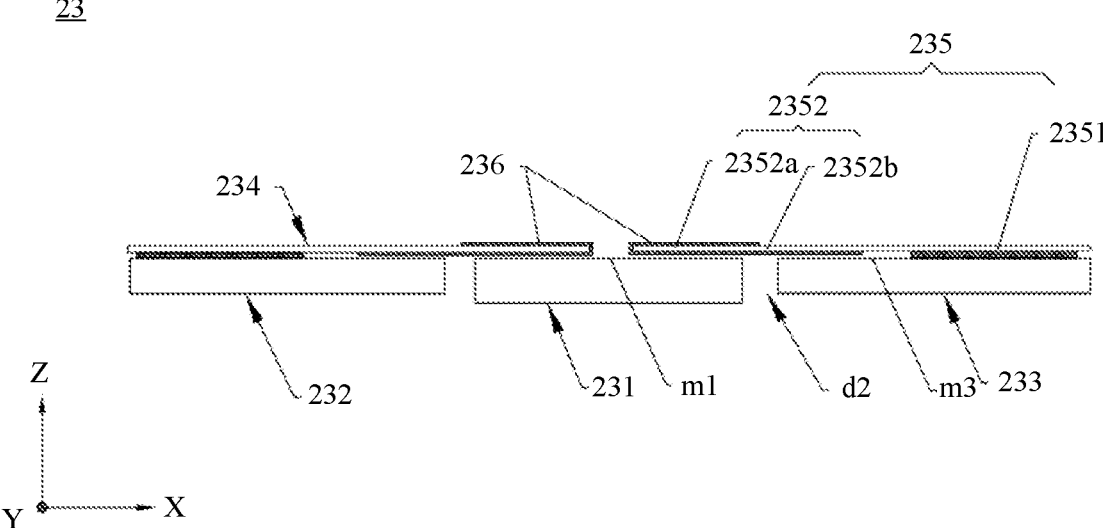
FIG. 11 is a schematic diagram of a structure of a rotating shaft apparatus according to some other embodiments of this application.

Specifically, referring to FIG. 11, FIG. 11 is a schematic diagram of a structure of a rotating shaft apparatus 23 according to some other embodiments of this application. In this embodiment, in addition to the first primary support member 231, the second primary support member 232, the third primary support member 233, and the first secondary support member 234, the rotating shaft apparatus 23 further includes a second secondary support member 235.

A structural form and a material of the second secondary support member 235 may be the same as those of the first secondary support member 234. This is not specifically limited herein.

The second secondary support member 235 includes a second connection part 2351 and a second cantilever part 2352 that are fixedly connected. The second connection part 2351 is located on a front side of the third primary support member 233, that is, the second connection part 2351 is located on a side facing the third support surface m3 of the third primary support member 233, and an orthographic projection of the second connection part 2351 on the third support surface m3 is located within the third support surface m3.

On the basis of the foregoing description, in some embodiments, the second connection part 2351 is connected to the third primary support member 233. Specifically, a connection manner of the second connection part 2351 on the third primary support member 233 may be the same as the connection manner of the first connection part 2341 on the second primary support member 232. Details are not described herein again.

The second cantilever part 2352 is in a cantilever shape. The second cantilever part 2352 includes a third cantilever segment 2352a. The third cantilever segment 2352a is a part, of the second cantilever part 2352, that is located on a side facing the third support surface m3 and whose orthographic projection on the third support surface m3 is located in the third support surface m3 when the rotating shaft apparatus 23 is in the unfolded state.

In this way, the second secondary support member 235 spans the second gap d2, and at least a part of the second secondary support member 235 covers the second gap d2. Specifically, the second cantilever part 2352 may further include a fourth cantilever segment 2352b. The fourth cantilever segment 2352b is located between the second connection part 2351 and the third cantilever segment 2352a. The fourth cantilever segment 2352b is a part, of the second cantilever part 2352, that is located on a side that is of the second gap d2 and that faces the foldable screen 10 and whose projection in the second gap d2 in the Z-axis direction is located in the second gap d2 when the rotating shaft apparatus 23 is in the unfolded state. In this way, the fourth cantilever segment 2352b covers the second gap d2. When the rotating shaft apparatus 23 is applied to the foldable-screen device 100, the foldable screen 10 is further located on a side that is of the second secondary support member 235 and that is away from the first primary support member 231 and the third primary support member 233. The rotating shaft apparatus 23 supports, by using the fourth cantilever segment 2352b of the second secondary support member 235, a part that is of the foldable screen 10 and that is opposite to the second gap d2, thereby improving support performance of the rotating shaft apparatus 23.

Figure 12:
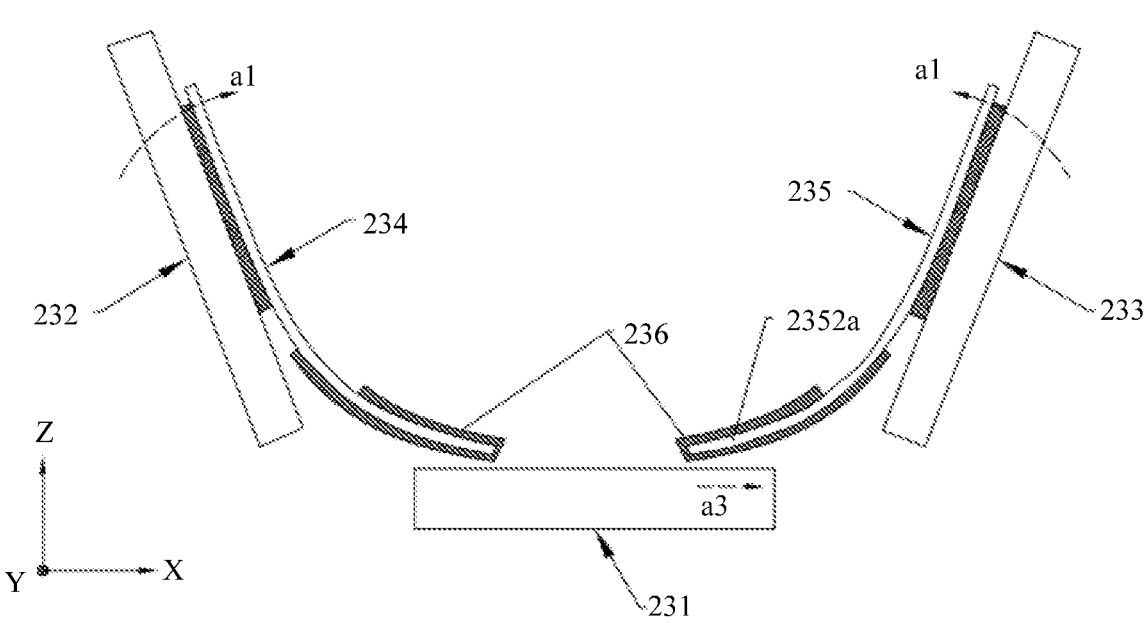
FIG. 12 is a schematic diagram of a structure generated when a third primary support member in the rotating shaft apparatus shown in FIG. 11 rotates relative to a first primary support member from an unfolded location to a folded location in a direction a1.

In the rotating shaft apparatus 23 in the foregoing embodiment, when the third primary support member 233 rotates relative to the first primary support member 231 between the unfolded location and the folded location, a part or a whole of the third cantilever segment 2352a (that is, at least a part of the third cantilever segment 2352a) slides relative to the first primary support member 231. For example, referring to FIG. 12, FIG. 12 is a schematic diagram of a structure generated when the third primary support member 233 in the rotating shaft apparatus 23 shown in FIG. 11 rotates relative to the first primary support member 231 from an unfolded location to a folded location in a direction a1. The whole of the third cantilever segment 2352a slides rightward relative to the first primary support member 231 in a direction a3. In this way, scraping is also generated between the third cantilever segment 2352a and the first primary support member 231, and noise is generated, causing relatively low user experience of the foldable-screen device.

To further reduce noise and improve user experience of the foldable-screen device, in some embodiments, still referring to FIG. 11 and FIG. 12, the lubrication structure 236 is further disposed between the at least a part of the third cantilever segment 2352a and the first primary support member 231.

In this way, lubrication is also performed between the at least a part of the third cantilever segment 2352a and the first primary support member 231 by using the lubrication structure 236, to prevent noise generated due to scraping between the at least a part of the third cantilever segment 2352a and the first primary support member 231, thereby further improving user experience of the foldable-screen device and improving product competitiveness.

In the foregoing embodiment, a part of the lubrication structure 236 may be disposed on a surface of the third cantilever segment 2352a. Specifically, a manner of disposing the part of the lubrication structure 236 on the surface of the third cantilever segment 2352a is the same as the manner of disposing the lubrication structure 236 on the surface of the first cantilever segment 2342a. Details are not described herein again.

A structural member such as a swing arm or a rotating shaft may also exist in the second gap d2. In this way, when the third primary support member 233 rotates relative to the first primary support member 231 between the unfolded location and the folded location, the fourth cantilever segment 2352b also slides relative to the structural member such as the swing arm or the rotating shaft in the second gap d2, and consequently noise may also be generated.

To resolve the foregoing problem, in some embodiments, still referring to FIG. 11 and FIG. 12, the lubrication structure 236 is further disposed between the fourth cantilever segment 2352b and the second gap d2. Optionally, a part of the lubrication structure 236 between the fourth cantilever segment 2352b and the second gap d2 may be disposed on a surface that is of the fourth cantilever segment 2352b and that faces the second gap d2.

In this way, lubrication is further performed between the fourth cantilever segment 2352b and a structural member such as a swing arm or a rotating shaft in the second gap d2 by using the lubrication structure 236, to prevent noise generated due to scraping between the fourth cantilever segment 2352b and the structural member in the second gap d2, thereby further improving user experience of the foldable-screen device.

It should be noted that, in addition to being disposed between the third cantilever segment 2352a and the first primary support member 231, and between the fourth cantilever segment 2352b and the second gap d2, the lubrication structure 236 may be further disposed in another location, for example, disposed on a part that is of the second cantilever part 2352 and that is opposite to the third primary support member 233, or disposed on the second connection part 2351. This is not specifically limited herein.

The lubrication structure 236 may further be in another structural form in addition to the foregoing structure.

Figure 13:
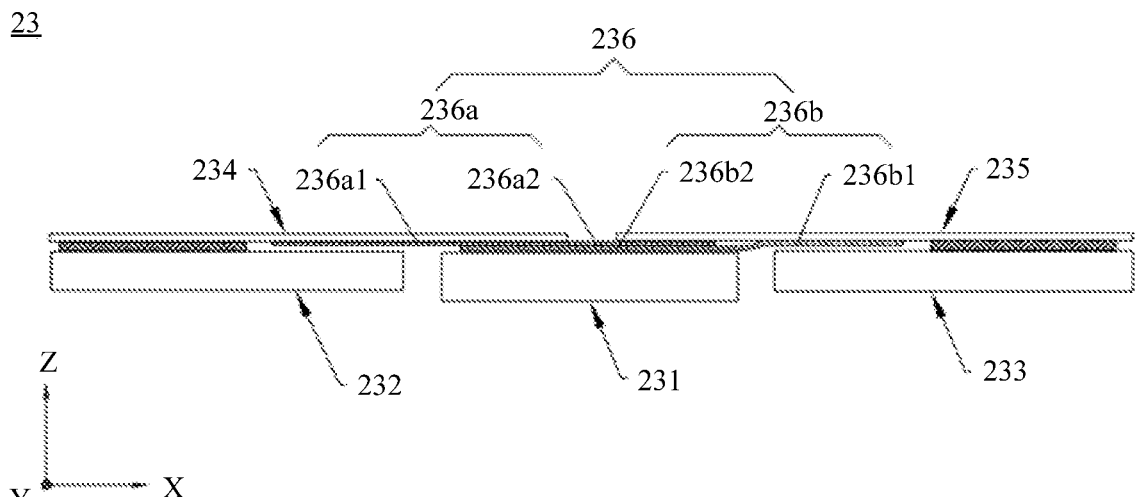
FIG. 13 is a schematic diagram of a structure of a rotating shaft apparatus according to some other embodiments of this application.

For example, referring to FIG. 13, FIG. 13 is a schematic diagram of a structure of a rotating shaft apparatus 23 according to some other embodiments of this application. In this embodiment, the lubrication structure 236 includes a first lubrication film 236a and a second lubrication film 236b.

The first lubrication film 236a includes a first fastening segment 236a1 and a first free segment 236a2.

The first fastening segment 236a1 is fastened to a surface that is of the first secondary support member 234 and that faces the first primary support member 231 and the second primary support member 232. Specifically, the first fastening segment 236a1 may be fastened to a surface that is of the first connection part 2341 in the first secondary support member 234 and that faces the second primary support member 232, and/or is fastened to a surface that is of a part, of the first cantilever part 2342, located on a front side of the second primary support member 232 and that faces the second primary support member 232, and/or is fastened to a surface that is of the second cantilever segment 2342b and that faces the first gap d1, and/or is fastened to a surface that is of the first cantilever segment 2342a and that faces the first primary support member 231. This is not specifically limited herein. The part that is of the first cantilever part 2342 and that is located on the front side of the second primary support member 232 is a part, of the first cantilever part 2342, that is located on the front side of the second primary support member 232 and whose orthographic projection on the second support surface m2 of the second primary support member 232 is located within the second support surface m2.

The first free segment 236a2 is located on a side that is of the first fastening segment 236a1 and that is close to the third primary support member 233.

The second lubrication film 236b includes a second fastening segment 236b1 and a second free segment 236b2.

The second fastening segment 236b1 is fastened to a surface that is of the second secondary support member 235 and that faces the first primary support member 231 and the third primary support member 233. Specifically, the second fastening segment 236b1 may be fastened to a surface that is of the second connection part 2351 in the second secondary support member 235 and that faces the third primary support member 233, and/or is fastened to a surface that is of a part, of the second cantilever part 2352, located on a front side of the third primary support member 233 and that faces the third primary support member 233, and/or is fastened to a surface that is of the fourth cantilever segment 2352b and that faces the second gap d2, and/or is fastened to a surface that is of the third cantilever segment 2352a and that faces the first primary support member 231. This is not specifically limited herein. The part that is of the second cantilever part 2352 and that is located on the front side of the third primary support member 233 is a part, of the second cantilever part 2352, that is located on the front side of the third primary support member 233 and whose orthographic projection on the third support surface m3 of the third primary support member 233 is located within the third support surface m3.

The second free segment 236b1 is located on a side that is of the second fastening segment 236b1 and that is close to the second primary support member 232.

The second free segment 236b1 is stacked with the first free segment 236a1.

Figure 14:
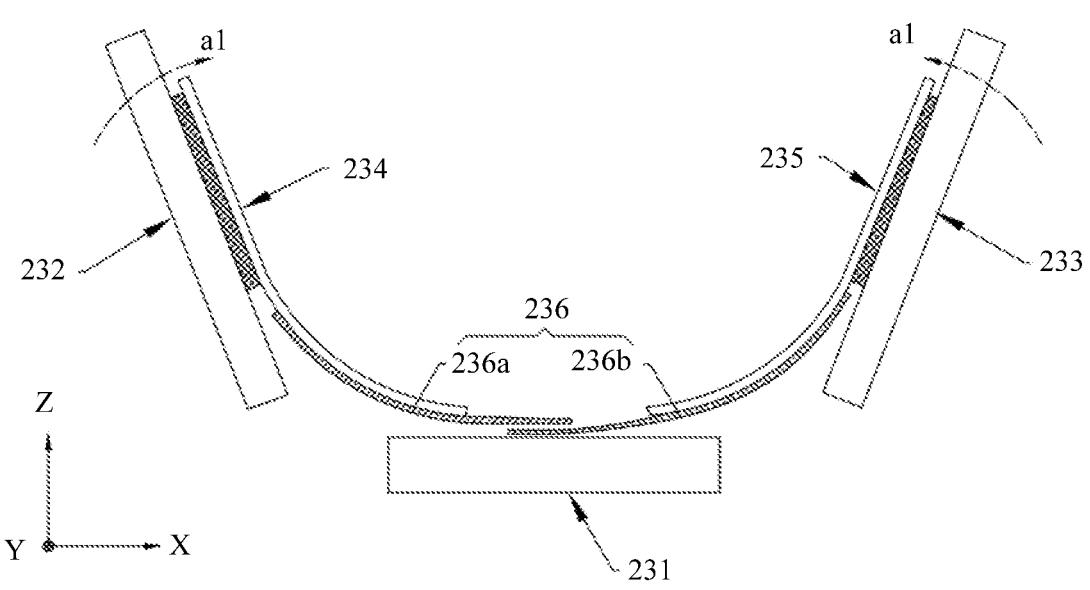
FIG. 14 is a schematic diagram of a structure generated when the rotating shaft apparatus shown in FIG. 13 rotates from an unfolded state to a folded state.

In this way, the first lubrication film 236a and the second lubrication film 236b are disposed in a staggered manner, to play a lubrication role and reduce noise. In addition, referring to FIG. 14, FIG. 14 is a schematic diagram of a structure generated when the rotating shaft apparatus 23 shown in FIG. 13 rotates from an unfolded state to a folded state. When the second primary support member 232 and the third primary support member 233 rotate relative to the first primary support member 231 between the unfolded location and the folded location, the first lubrication film 236a and the second lubrication film 236b may slide relative to each other, to avoid affecting movement of the first secondary support member 234 and the second secondary support member 235 relatively away from or close to each other.

In the foregoing embodiment, the first lubrication film 236a and the second lubrication film 236b may be structures with a smooth surface.

Figure 15:
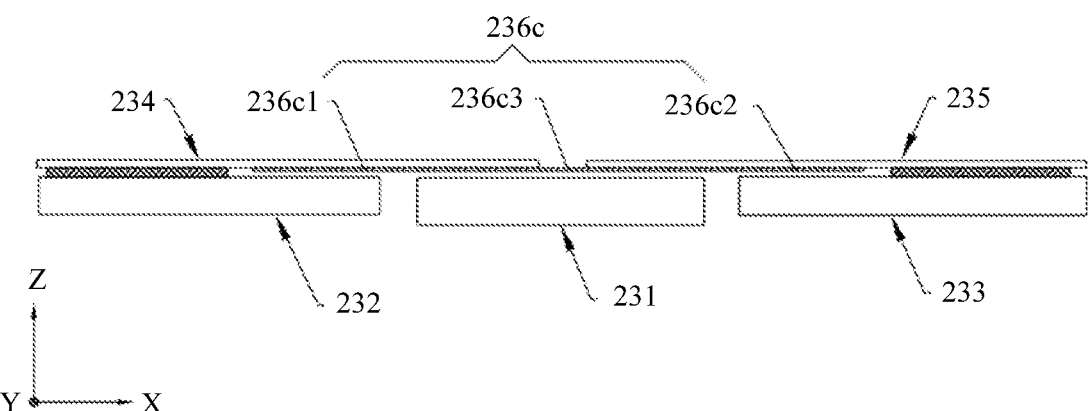
FIG. 15 is a schematic diagram of a structure of a rotating shaft apparatus according to some other embodiments of this application.

For another example, referring to FIG. 15, FIG. 15 is a schematic diagram of a structure of a rotating shaft apparatus 23 according to some other embodiments of this application. In this embodiment, the lubrication structure 236 includes a third lubrication film 236c. The third lubrication film 236c includes a first lubrication film region 236c1, a second lubrication film region 236c2, and a third lubrication film region 236c3.

The first lubrication film region 236c1 is fastened to the surface that is of the first secondary support member 234 and that faces the first primary support member 231 and the second primary support member 232. Specifically, the first lubrication film region 236c1 may be fastened to the surface that is of the first connection part 2341 in the first secondary support member 234 and that faces the second primary support member 232, and/or is fastened to the surface that is of the part, of the first cantilever part 2342, located on the front side of the second primary support member 232 and that faces the second primary support member 232, and/or is fastened to the surface that is of the second cantilever segment 2342b and that faces the first gap d1, and/or is fastened to the surface that is of the first cantilever segment 2342a and that faces the first primary support member 231. This is not specifically limited herein.

The second lubrication film region 236c2 is fastened to the surface that is of the second secondary support member 235 and that faces the first primary support member 231 and the third primary support member 233. Specifically, the second lubrication film region 236c2 may be fastened to the surface that is of the second connection part 2351 in the second secondary support member 235 and that faces the third primary support member 233, and/or is fastened to the surface that is of the part, of the second cantilever part 2352, located on a front side of the third primary support member 233 and that faces the third primary support member 233, and/or is fastened to the surface that is of the fourth cantilever segment 2352b and that faces the second gap d2, and/or is fastened to the surface that is of the third cantilever segment 2352a and that faces the first primary support member 231. This is not specifically limited herein.

The third lubrication film region 236c3 is connected between the first lubrication film region 236c1 and the second lubrication film region 236c2, and the third lubrication film region 236c3 can be elastically stretched and contracted in a direction that points from the first lubrication film region 236c1 to the second lubrication film region 236c2. In some embodiments, at least a specific segment of or a whole of the third lubrication film region 236c3 of the third lubrication film 236c is a soft elastic structure. Specifically, a material of the soft elastic structure includes but is not limited to an elastic material that includes polyurethane, rubber, latex, or the like. The first lubrication film region 236c1 and the second lubrication film region 236c2 may be structures with a smooth surface, or may be soft elastic structures. In some embodiments, the first lubrication film region 236c1, the second lubrication film region 236c2, and the third lubrication film region 236c3 are all soft elastic structures and have a same material. In this way, the first lubrication film region 236c1, the second lubrication film region 236c2, and the third lubrication film region 236c3 may be formed integrally, thereby reducing structural complexity of the third lubrication film 236c.

Figure 16:
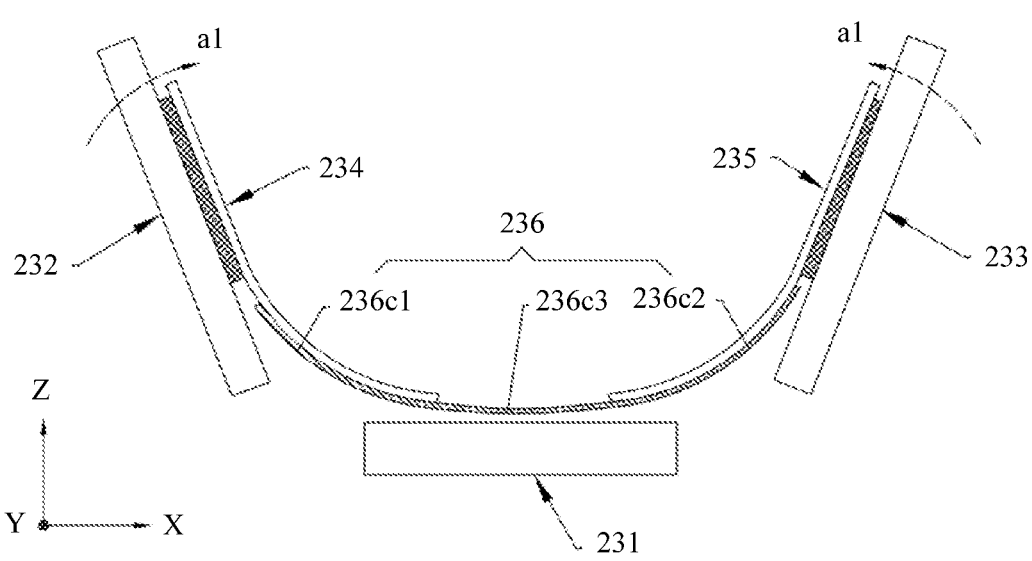
FIG. 16 is a schematic diagram of a structure generated when the rotating shaft apparatus shown in FIG. 15 rotates from an unfolded state to a folded state.

In this way, when the second primary support member 232 and the third primary support member 233 rotate from the unfolded location to the folded location, referring to FIG. 16, FIG. 16 is a schematic diagram of a structure generated when the rotating shaft apparatus 23 shown in FIG. 15 rotates from an unfolded state to a folded state. The third lubrication film region 236c3 is in a stretched state and accumulates elastic force. When the second primary support member 232 and the third primary support member 233 rotate from the folded location to the unfolded location, the third lubrication film region 236c3 contracts under the accumulated elastic force. Therefore, when the second primary support member 232 and the third primary support member 233 rotate relative to the first primary support member 231 between the unfolded location and the folded location, the third lubrication film region 236c3 is elastically stretched and contracted, to avoid affecting movement of the first secondary support member 234 and the second secondary support member 235 relatively away from or close to each other. In addition, the rotating shaft apparatus 23 in this embodiment can use the third lubrication film 236c to lubricate both the first secondary support member 234 and the second secondary support member 235 and reduce noise. Therefore, a composition structure of the rotating shaft apparatus 23 is simple and easy to implement.

Further, for example, the lubrication structure 236 may include a fourth lubrication film (not shown in the figure) and a fifth lubrication film (not shown in the figure). One end of the fourth lubrication film is fastened to the surface that is of the first secondary support member 234 and that faces the first primary support member 231 and the second primary support member 232, and the other end is fastened to the first primary support member 231. The fourth lubrication film can be elastically stretched and contracted from the end of the first secondary support member 234 to the end fastened to the first primary support member 231. In some embodiments, a specific segment or a whole of the fourth lubrication film is a soft elastic structure. Specifically, a material of the soft elastic structure includes but is not limited to an elastic material that includes polyurethane, rubber, latex, or the like. One end of the fifth lubrication film is fastened to the surface that is of the second secondary support member 235 and that faces the first primary support member 231 and the third primary support member 233, and the other end is fastened to the first primary support member 231. The fifth lubrication film can be elastically stretched and contracted from the end fastened to the second secondary support member 235 to the end fastened to the first primary support member 231. In this way, when the second primary support member 232 and the third primary support member 233 rotate from the unfolded location to the folded location, the fourth lubrication film and the fifth lubrication film are elastically stretched and contracted, to avoid affecting movement of the first secondary support member 234 and the second secondary support member 235 relatively away from or close to each other.

Referring back to FIG. 6, to improve support performance of the rotating shaft apparatus 23 in the second gap d2, in some other embodiments, an area of the first secondary support member 234 may be increased, so that the first secondary support member 234 can further cover the second gap d2 while covering the first gap d1.

Figure 17:
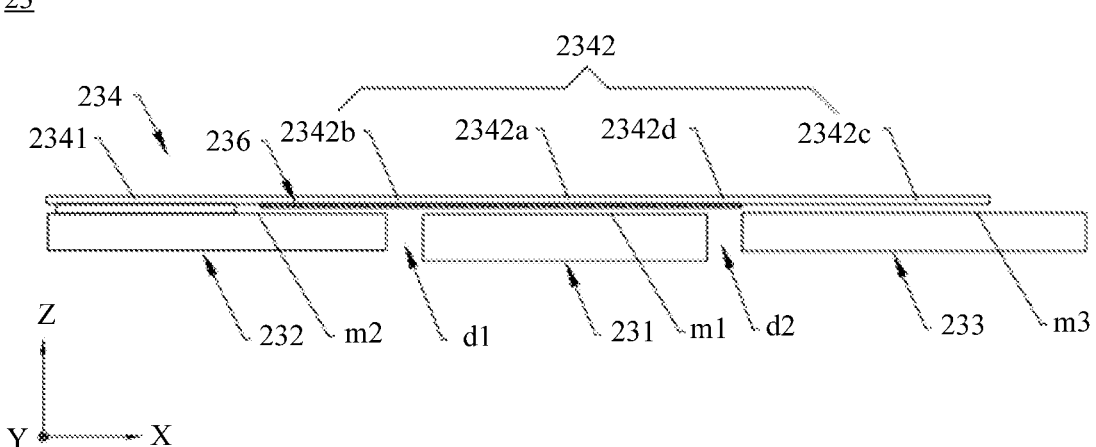
FIG. 17 is a schematic diagram of a structure of a rotating shaft apparatus according to some other embodiments of this application.

Specifically, referring to FIG. 17, FIG. 17 is a schematic diagram of a structure of a rotating shaft apparatus 23 according to some other embodiments of this application. In this embodiment, the first cantilever part 2342 further includes a fifth cantilever segment 2342c. The fifth cantilever segment 2342c is located on a side that is of the first cantilever segment 2342a and that is away from the first connection part 2341. The fifth cantilever segment 2342c is a part, of the first cantilever part 2342, that is located on the side facing the third support surface m3 and whose orthographic projection on the third support surface m3 is located in the third support surface m3 when the rotating shaft apparatus 23 is in the unfolded state.

In this way, the first secondary support member 234 further spans the second gap d2 in addition to spanning the first gap d1. Specifically, referring to FIG. 17, the first cantilever part 2342 may further include a sixth cantilever segment 2342d. The sixth cantilever segment 2342d is located between the first cantilever segment 2342a and the fifth cantilever segment 2342c. The sixth cantilever segment 2342d is a part, of the first cantilever part 2342, that is located on the side that is of the second gap d2 and that faces the foldable screen 10 and whose projection in the second gap d2 in the Z-axis direction is located in the second gap d2 when the rotating shaft apparatus 23 is in the unfolded state. In this way, the sixth cantilever segment 2342d covers the second gap d2. When the rotating shaft apparatus 23 is applied to the foldable-screen device 100, the foldable screen 10 is located on a side that is of the first secondary support member 234 and that is away from the first primary support member 231, the second primary support member 232, and the third primary support member 233. In addition to improving, by using the second cantilever segment 2342b of the first secondary support member 234, support strength on the part that is of the foldable screen 10 and that is opposite to the first gap d1, the rotating shaft apparatus 23 further improves, by using the sixth cantilever segment 2342d of the first secondary support member 234, support strength on the part that is of the foldable screen 10 and that is opposite to the second gap d2.

Figure 18:
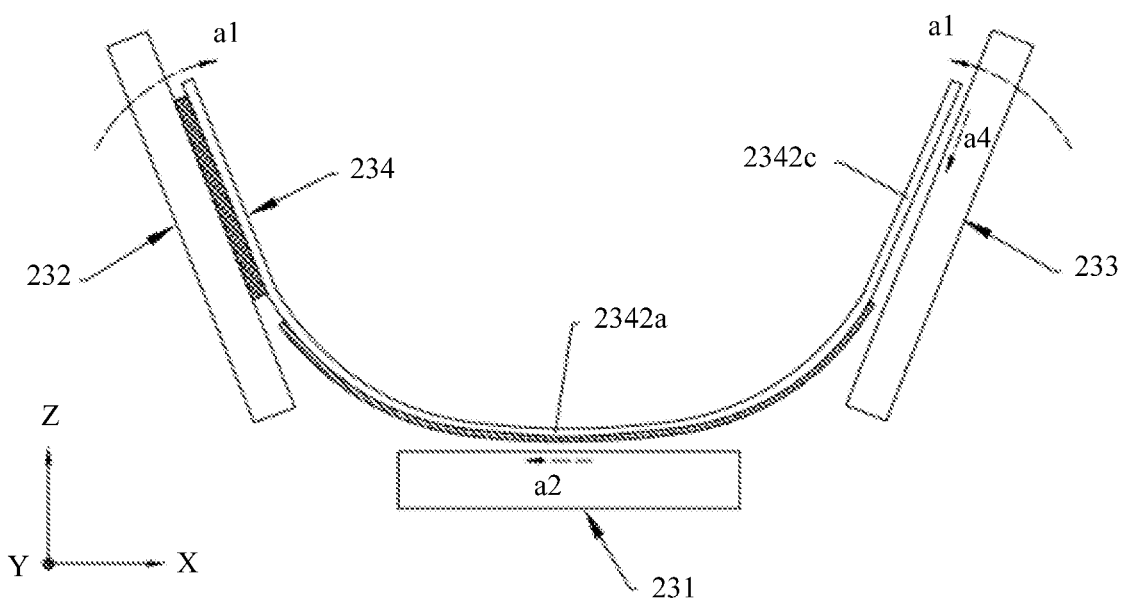
FIG. 18 is a schematic diagram of a structure generated when a second primary support member and a third primary support member in the rotating shaft apparatus shown in FIG. 17 rotate relative to a first primary support member from an unfolded location to a folded location in a direction a1.

However, in the rotating shaft apparatus 23 in the foregoing embodiment, when the second primary support member 232 and the third primary support member 233 rotate relative to the first primary support member 231 between the unfolded location and the folded location, the at least a part of the first cantilever segment 2342a slides relative to the first primary support member 231, and at least a part of the fifth cantilever segment 2342c also slides relative to the third primary support member 233. For example, referring to FIG. 18, FIG. 18 is a schematic diagram of a structure generated when the second primary support member 232 and the third primary support member 233 in the rotating shaft apparatus 23 shown in FIG. 17 rotate relative to the first primary support member 231 from an unfolded location to a folded location in a direction a1. A part of the first cantilever segment 2342a slides leftward relative to the first primary support member 231 in a direction a2, and a whole of the fifth cantilever segment 2342c slides to the lower left in a direction a4. In this way, scraping is generated between the part of the first cantilever segment 2342a and the first primary support member 231, and between the whole of the fifth cantilever segment 2342c and the third primary support member 233, and noise is generated, causing relatively low user experience of the foldable-screen device.

Figure 19:
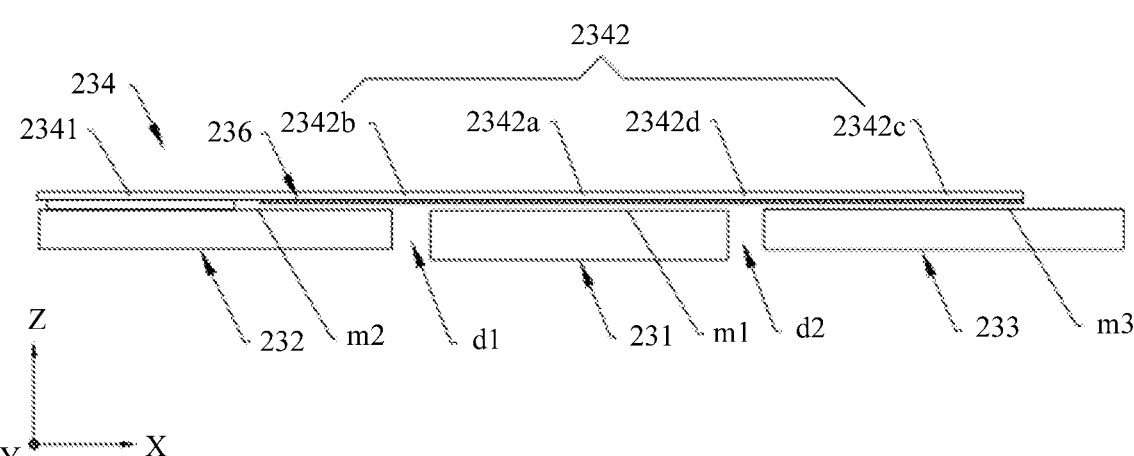
FIG. 19 is a schematic diagram of a structure of a rotating shaft apparatus according to some other embodiments of this application.

To further reduce noise of the foldable-screen device, in some embodiments, referring to FIG. 19, FIG. 19 is a schematic diagram of a structure of a rotating shaft apparatus 23 according to some other embodiments of this application. In addition to being disposed between the at least a part of the first cantilever segment 2342a and the first primary support member 231, the lubrication structure 236 is further disposed between the at least a part of the fifth cantilever segment 2342c and the third primary support member 233.

In this way, lubrication is also performed between the at least a part of the fifth cantilever segment 2342c and the third primary support member 233 by using the lubrication structure 236, to prevent noise generated due to scraping between the at least a part of the fifth cantilever segment 2342c and the third primary support member 233, thereby further improving user experience of the foldable-screen device.

It should be noted that, in addition to being disposed between the at least a part of the first cantilever segment 2342a and the first primary support member 231, the lubrication structure 236 may be is further disposed between the at least a part of the fifth cantilever segment 2342c and the third primary support member 233; or may be disposed between the at least a part of the first cantilever segment 2342a and the first primary support member 231, but is not disposed between the at least a part of the fifth cantilever segment 2342c and the third primary support member 233; or may be disposed between the at least a part of the fifth cantilever segment 2342c and the third primary support member 233, but is not disposed between the at least a part of the first cantilever segment 2342a and the first primary support member 231. This is not specifically limited herein.

On the basis of the foregoing embodiment, in some embodiments, the lubrication structure 236 is further disposed between the sixth cantilever segment 2342d and the second gap d2. Specifically, a part of the lubrication structure 236 may be disposed on a surface that is of the sixth cantilever segment 2342d and that faces the second gap d2.

In this way, lubrication is further performed between the sixth cantilever segment 2342d and a structural member such as a swing arm and a rotating shaft in the second gap d2 by using the lubrication structure 236, to prevent noise generated due to scraping between the sixth cantilever segment 2342d and the structural member in the second gap d2, thereby further improving user experience of the foldable-screen device.

Figure 20:
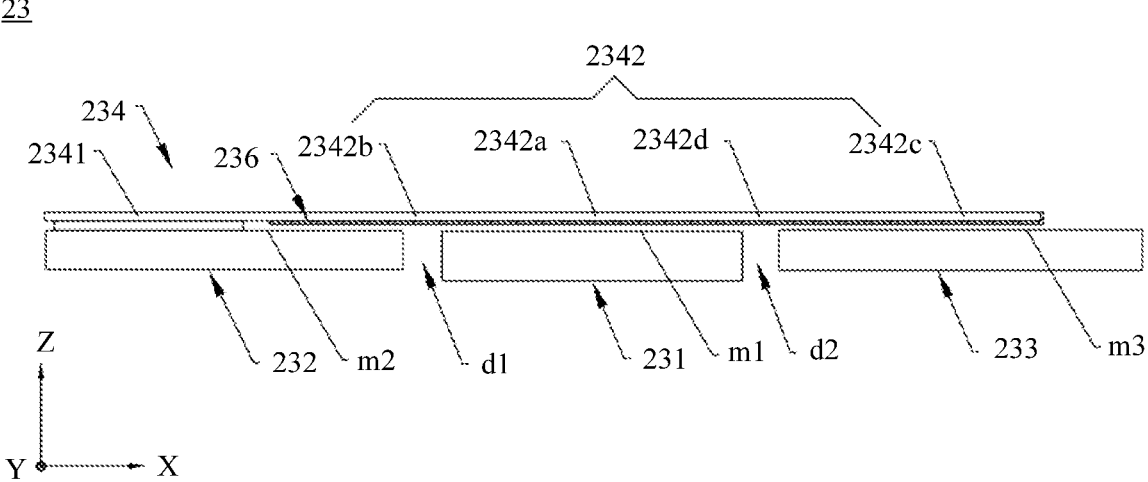
FIG. 20 is a schematic diagram of a structure of a rotating shaft apparatus according to some other embodiments of this application.
Figure 21:
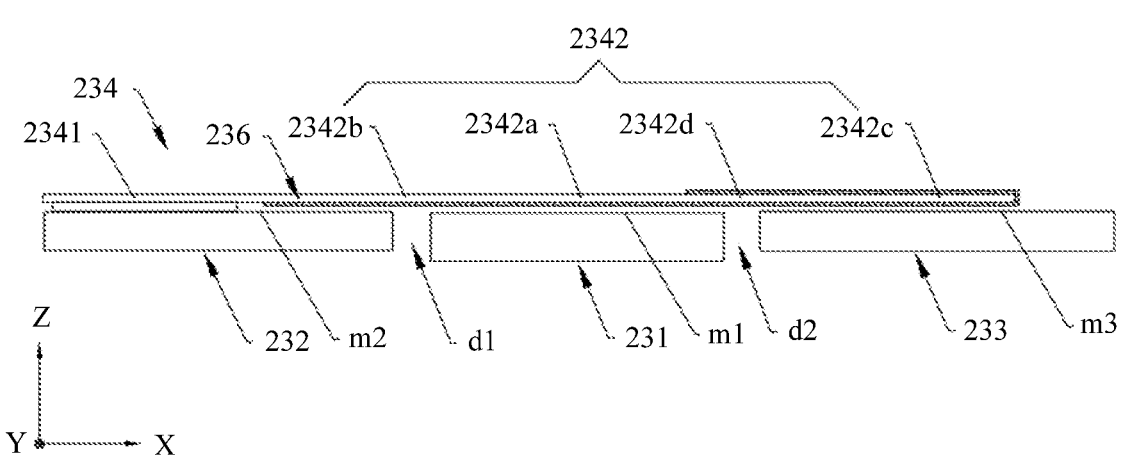
FIG. 21 is a schematic diagram of a structure of a rotating shaft apparatus according to some other embodiments of this application.

It should be noted that, the lubrication structure 236 may be further disposed at another location in addition to being disposed between the at least a part of the first cantilever segment 2342a and the first primary support member 231, between the second cantilever segment 2342b and the first gap d1, between the at least a part of the fifth cantilever segment 2342c and the third primary support member 233, and between the sixth cantilever segment 2342d and the second gap d2, for example, disposed on an end surface (as shown in FIG. 20) of an end that is of the fifth cantilever segment 2342c and that is away from the first cantilever segment 2342a, or disposed on a surface (as shown in FIG. 21) that is of the fifth cantilever segment 2342c and that is away from the third primary support member 233. This is not specifically limited herein.

Figure 22:
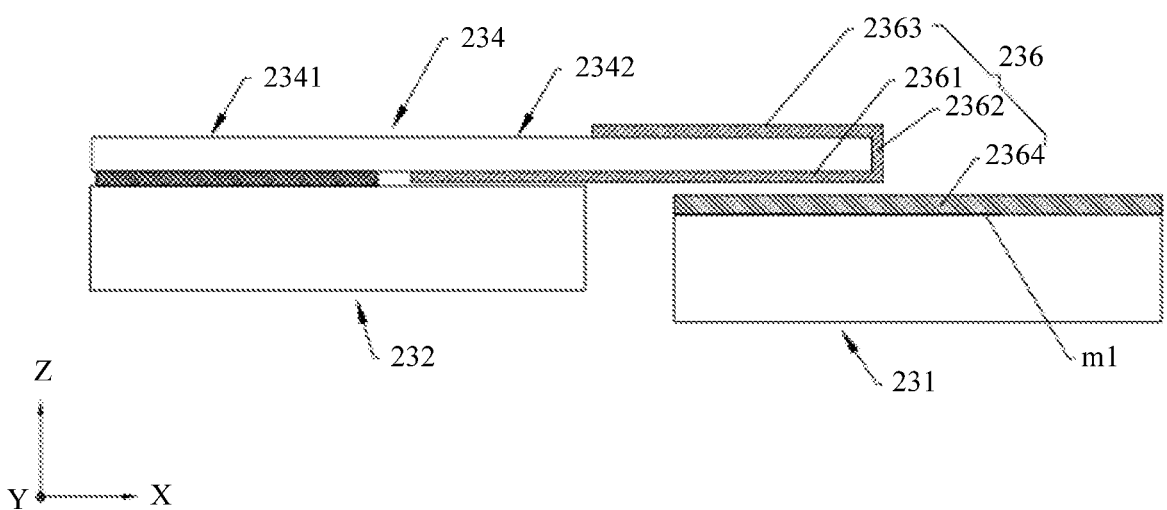
FIG. 22 is a schematic diagram of a structure of a rotating shaft apparatus according to some other embodiments of this application.

On the basis of any one of the foregoing embodiments, referring to FIG. 22, FIG. 22 is a schematic diagram of a structure of a rotating shaft apparatus 23 according to some other embodiments of this application. In this embodiment, the lubrication structure 236 may include a fourth lubrication layer 2364. The fourth lubrication layer 2364 is disposed on a support surface (that is, the first support surface m1) of the first primary support member 231. In this way, lubrication may be performed between the first cantilever segment 2342a of the first secondary support member 234 and the first primary support member 231, and between the third cantilever segment 2352a of the second secondary support member 235 and the first primary support member 231 by using the fourth lubrication layer 2364, to prevent noise generated due to scraping between the first cantilever segment 2342a and the first primary support member 231 and between the third cantilever segment 2352a and the first primary support member 231, thereby improving user experience of the foldable-screen device. In addition, lubrication between the first secondary support member 234 and the first primary support member 231 and lubrication between the second secondary support member 235 and the first primary support member 231 can be implemented simultaneously by using the fourth lubrication layer 2364, which helps reduce structural complexity of the rotating shaft apparatus 23.

According to the descriptions of the foregoing embodiments, in the first secondary support member 234, the first connection part 2341 is located on the front side of the second primary support member 232 and is connected to the second primary support member 232, and the first cantilever segment 2342a of the first cantilever part 2342 is located on a front side of the first primary support member 231. In some other embodiments, locations of the first connection part 2341 and the first cantilever segment 2342a may be interchanged.

Figure 23:
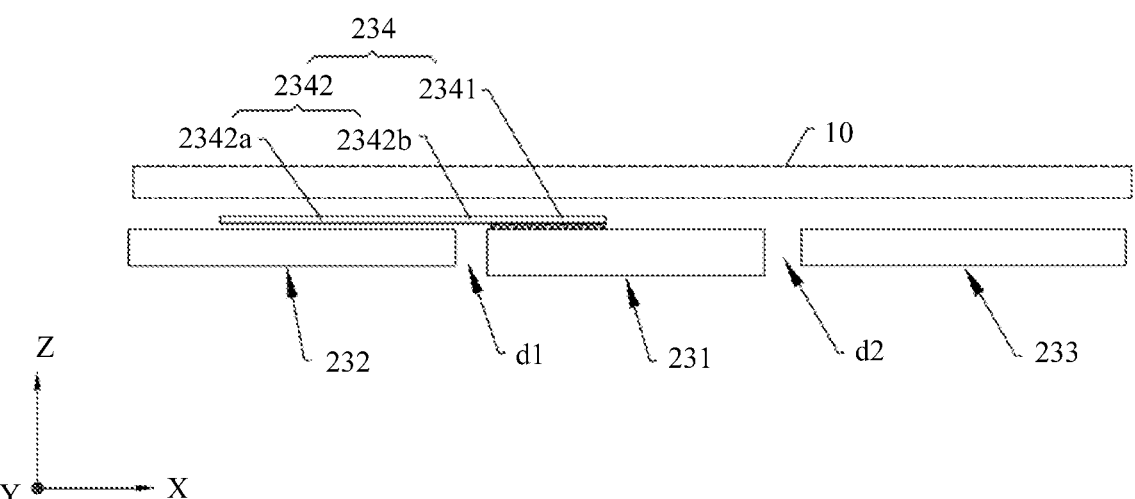
FIG. 23 is a schematic diagram of a structure of a rotating shaft apparatus according to some other embodiments of this application.

Specifically, referring to FIG. 23, FIG. 23 is a schematic diagram of a structure of a rotating shaft apparatus 23 according to some other embodiments of this application. In this embodiment, the first connection part 2341 is located on the side facing the first support surface m1 and is connected to the first primary support member 231. The first cantilever segment 2342a of the first cantilever part 2342 is a part, of the first cantilever part 2342, that is located on the side facing the second support surface m2 and whose orthographic projection on the second support surface m2 is located within the second support surface m2 when the rotating shaft apparatus 23 is in the unfolded state.

In this way, the first secondary support member 234 also spans the first gap d1, and at least a part of the first secondary support member 234 covers the first gap d1. Specifically, the second cantilever segment 2342b of the first cantilever part 2342 is located on the side that is of the first gap d1 and that faces the foldable screen 10, and when the rotating shaft apparatus 23 is in the unfolded state, a projection of the second cantilever segment 2342b in the first gap d1 along the Z-axis direction is located within the first gap d1. In this way, the rotating shaft apparatus 23 also supports, by using the second cantilever segment 2342b, the part that is of the foldable screen 10 and that is opposite to the first gap d1, thereby improving support performance of the rotating shaft apparatus 23.

On the basis of the foregoing description, a whole or a part (that is, at least a part) of the first cantilever segment 2342a is in contact with the second primary support member 232, and slides relative to the second primary support member 232. In addition, the second cantilever segment 2342b is in contact with and slides relative to a structural member such as a swing arm or a rotating shaft in the first gap d1, and noise is generated due to scraping during sliding.

Figure 24:
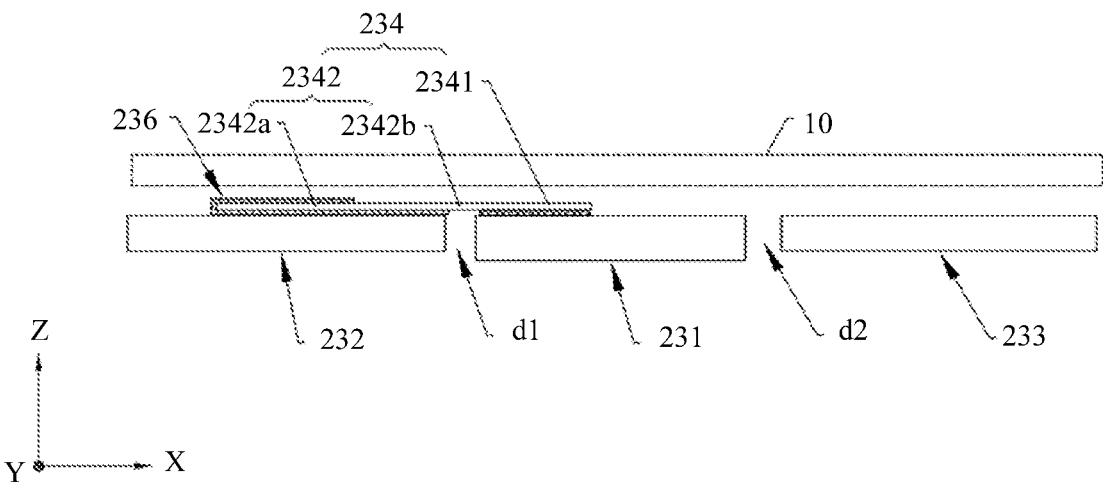
FIG. 24 is a schematic diagram of a structure of a rotating shaft apparatus according to some other embodiments of this application.

To reduce noise of the foldable-screen device, in some embodiments, referring to FIG. 24, FIG. 24 is a schematic diagram of a structure of a rotating shaft apparatus 23 according to some other embodiments of this application. In this embodiment, the rotating shaft apparatus 23 further includes a lubrication structure 236. The lubrication structure 236 is disposed at least between the at least a part of the first cantilever segment 2342a and the second primary support member 232.

The lubrication structure 236 may be a structure with a smooth surface, to be specific, the lubrication structure 236 may be a type of structure whose surface friction coefficient is less than 0.25. Specifically, the surface friction coefficient of the lubrication structure 236 may be 0.24, 0.23, 0.2, 0.1, 0.05, 0.02, 0.01, or the like. On this basis, a material of the lubrication structure 236 includes but is not limited to a compound including a fluorine element. For example, the material of the lubrication structure 236 is polytetrafluoro-ethylene. In some other embodiments, the material of the lubrication structure 236 may alternatively be polyoxymeth-ylene (polyoxymethylene, POM). In this way, the surface friction coefficient of the lubrication structure 236 is decreased to reduce noise.

The lubrication structure 236 may alternatively be a soft elastic structure. The material of the lubrication structure 236 includes but is not limited to an elastic material includ-ing polyurethane, rubber, latex, or the like. In this way, the lubrication structure 236 reduces noise by avoiding hard contact between two structures that scrape against each other.

In this way, lubrication is performed between the at least a part of the first cantilever segment 2342a and the second primary support member 232 by using the lubrication struc-ture 236, to prevent noise generated due to scraping between the at least a part of the first cantilever segment 2342a and the second primary support member 232, thereby improving user experience of the foldable-screen device.

It should be noted that, on the basis of the foregoing embodiment, a manner of disposing the lubrication structure 236 between the at least a part of the first cantilever segment 2342a and the second primary support member 232 may be similar to the manner of disposing the lubrication structure 236 between the at least a part of the first cantilever segment 2342a and the first primary support member 231 in the foregoing embodiment. Details are not described herein again.

In some embodiments, to avoid noise generated due to relative sliding between the second cantilever segment 2342b and a structural member such as a swing arm or a rotating shaft in the first gap d1, in some embodiments, referring to FIG. 24, the lubrication structure 236 may be further disposed between the second cantilever segment 2342b and the first gap d1. In this way, lubrication is further performed between the second cantilever segment 2342b and a structural member such as a swing arm or a rotating shaft in the first gap d1 by using the lubrication structure 236, to prevent noise generated due to scraping between the second cantilever segment 2342b and the structural member in the first gap d1, thereby further improving user experience of the foldable-screen device.

Figure 25:
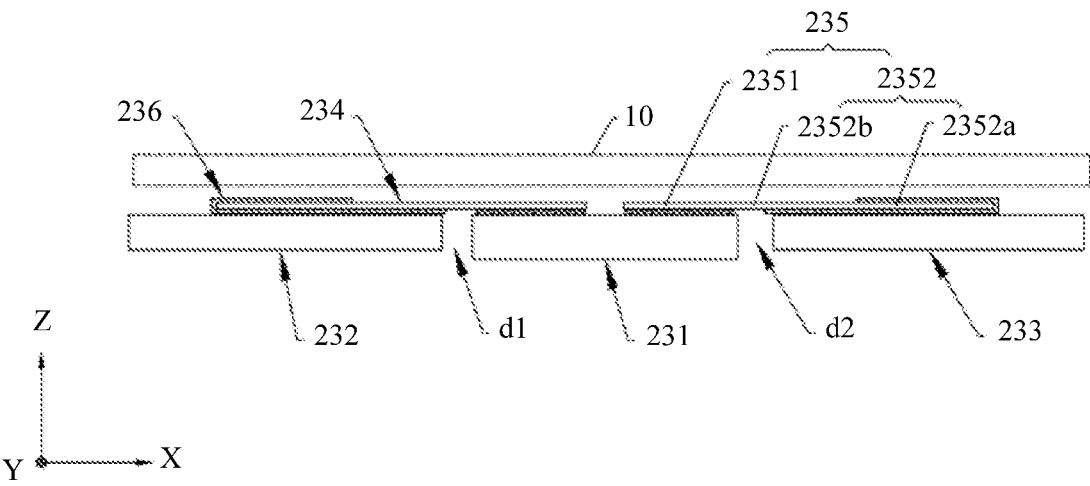
FIG. 25 is a schematic diagram of a structure of a rotating shaft apparatus according to some other embodiments of this application.

On the basis of the foregoing embodiment, in some embodiments, referring to FIG. 25, FIG. 25 is a schematic diagram of a structure of a rotating shaft apparatus 23 according to some other embodiments of this application. In this embodiment, the rotating shaft apparatus 23 further includes a second secondary support member 235. The second secondary support member 235 includes a second connection part 2351 and a second cantilever part 2352 that are fixedly connected. The second connection part 2351 is located on the side facing the first support surface m1 and is connected to the first primary support member 231, and the second cantilever part 2352 includes a third cantilever segment 2352a. The third cantilever segment 2352a of the second cantilever part 2352 is a part, of the second cantilever part 2352, that is located on a side facing the third support surface m3 and whose orthographic projection on the third support surface m3 is located within the third support surface m3 when the rotating shaft apparatus 23 is in the unfolded state.

In this way, the second secondary support member 235 also spans the second gap d2, and at least a part of the second secondary support member 235 covers the second gap d2. Specifically, the second cantilever part 2352 may further include a fourth cantilever segment 2352b. The fourth cantilever segment 2352b is located on a side that is of the second gap d2 and that faces the foldable screen 10, and when the rotating shaft apparatus 23 is in the unfolded state, a projection of the fourth cantilever segment 2352b in the second gap d2 in the Z-axis direction is located in the second gap d2. In this way, the rotating shaft apparatus 23 supports, by using the fourth cantilever segment 2352b, a part that is of the foldable screen 10 and that is opposite to the second gap d2, thereby improving support performance of the rotating shaft apparatus 23.

On the basis of the foregoing description, a whole or a part (that is, at least a part) of the third cantilever segment 2352a is in contact with the third primary support member 233, and slides relative to the third primary support member 233. In addition, the fourth cantilever segment 2352b is in contact with and slides relative to a structural member such as a swing arm or a rotating shaft in the second gap d2, and noise is generated due to scraping during sliding.

To further reduce noise of the foldable-screen device, in some embodiments, still referring to FIG. 25, the lubrication structure 236 is further disposed between the at least a part of the third cantilever segment 2352a and the third primary support member 233.

In this way, lubrication is performed between the at least a part of the third cantilever segment 2352a and the third primary support member 233 by using the lubrication struc-ture 236, to prevent noise generated due to scraping between the at least a part of the third cantilever segment 2352a and the third primary support member 233, thereby further improving user experience of the foldable-screen device.

It should be noted that, on the basis of the foregoing embodiment, a manner of disposing the lubrication structure 236 between the at least a part of the third cantilever segment 2352a and the third primary support member 233 may be similar to the manner of disposing the lubrication structure 236 between the at least a part of the first cantilever segment 2342a and the first primary support member 231 in the foregoing embodiment. Details are not described herein again.

In some embodiments, to avoid noise generated due to relative sliding between the fourth cantilever segment 2352*b* and a structural member such as a swing arm or a rotating shaft in the second gap d2, in some embodiments, still referring to FIG. 25, the lubrication structure 236 may be further disposed between the fourth cantilever segment 2352*b* and the second gap d2. In this way, lubrication is further performed between the fourth cantilever segment 2352*b* and the structural member such as the swing arm or the rotating shaft in the second gap d2 by using the lubrication structure 236, to prevent noise generated due to scraping between the fourth cantilever segment 2352*b* and the structural member in the second gap d2, thereby further improving user experience of the foldable-screen device.

In the description of this specification, specific features, structures, materials, or characteristics may be properly combined in any one or more embodiments or examples.

Finally, it should be noted that the foregoing embodiments are only used to illustrate the technical solutions in this application, but are not used to limit this application. Although this application has been described in detail with reference to the foregoing embodiments, it should be understood by a person of ordinary skill in the art that the technical solutions described in the foregoing embodiments may still be modified, or some technical features thereof may be equivalently replaced. These modifications or replacements do not make the essence of the corresponding technical solutions depart from the spirit and scope of the technical solutions in the embodiments of this application.

The invention claimed is:

1. A rotating shaft apparatus, comprising:
a first primary support member, having a first support surface, wherein the first support surface is configured to support a part of a foldable screen;
a second primary support member, having a second support surface, wherein the second support surface is configured to support a part of the foldable screen, and the second primary support member can rotate relative to the first primary support member between an unfolded location and a folded location;
a first secondary support member, comprising a first connection part and a first cantilever part that are fixedly connected, wherein the first connection part is located on a side facing the second support surface and is connected to the second primary support member, the first cantilever part comprises a first cantilever segment, the first cantilever segment is located on a side facing the first support surface, and when the second primary support member rotates relative to the first primary support member between the unfolded location and the folded location, at least a part of the first cantilever segment slides relative to the first primary support member; and
a lubrication structure, disposed at least between the at least a part of the first cantilever segment and the first primary support member.

2. The rotating shaft apparatus according to claim 1, wherein the lubrication structure comprises a first lubrication layer; and
the first lubrication layer is disposed on a surface that is of the at least a part of the first cantilever segment and that faces the first primary support member.

3. The rotating shaft apparatus according to claim 1, wherein an end that is of the first cantilever segment and that is away from the first connection part is a first end, and the first end forms an end that is of the first cantilever part and that is away from the first connection part;

the lubrication structure further comprises a second lubrication layer; and
the second lubrication layer is disposed on an end surface of the first end.

4. The rotating shaft apparatus according to claim 3, wherein the lubrication structure further comprises a third lubrication layer; and
the third lubrication layer is disposed on a surface that is of the first cantilever segment and that is away from the first primary support member.

5. The rotating shaft apparatus according to claim 1, wherein there is a first gap between the first primary support member and the second primary support member;
the first cantilever part further comprises a second cantilever segment, and the second cantilever segment is located on a side that is of the first gap and that faces the foldable screen; and
the lubrication structure is further disposed between the second cantilever segment and the first gap.

6. The rotating shaft apparatus according to claim 1, further comprising:
a third primary support member, located on a side that is of the first primary support member and that is away from the second primary support member, wherein the third primary support member has a third support surface, the third support surface is configured to support a part of the foldable screen, and the third primary support member can also rotate relative to the first primary support member between the unfolded location and the folded location; and
a second secondary support member, comprising a second connection part and a second cantilever part that are fixedly connected, wherein the second connection part is located on a side facing the third support surface and is connected to the third primary support member, the second cantilever part comprises a third cantilever segment, the third cantilever segment is located on the side facing the first support surface, and when the third primary support member rotates relative to the first primary support member between the unfolded location and the folded location, at least a part of the third cantilever segment slides relative to the first primary support member, wherein
the lubrication structure is further disposed at least between the at least a part of the third cantilever segment and the first primary support member.

7. The rotating shaft apparatus according to claim 6, wherein there is a second gap between the first primary support member and the third primary support member;
the second cantilever part further comprises a fourth cantilever segment, and the fourth cantilever segment is located on a side that is of the second gap and that faces the foldable screen; and
the lubrication structure is further disposed between the fourth cantilever segment and the second gap.

8. The rotating shaft apparatus according to claim 6, wherein the lubrication structure comprises a first lubrication film and a second lubrication film;
the first lubrication film comprises a first fastening segment and a first free segment, the first fastening segment is fastened to a surface that is of the first secondary support member and that faces the first primary support member and the second primary support member, and the first free segment is located on a side that is of the first fastening segment and that is close to the third primary support member;

the second lubrication film comprises a second fastening segment and a second free segment, the second fastening segment is fastened to a surface that is of the second secondary support member and that faces the first primary support member and the third primary support member, and the second free segment is located on a side that is of the second fastening segment and that is close to the second primary support member; and the second free segment is stacked with the first free segment.

9. The rotating shaft apparatus according to claim 6, wherein the lubrication structure comprises a third lubrication film;

the third lubrication film comprises a first lubrication film region, a second lubrication film region, and a third lubrication film region;

the first lubrication film region is fastened to the surface that is of the first secondary support member and that faces the first primary support member and the second primary support member, the second lubrication film region is fastened to a surface that is of the second secondary support member and that faces the first primary support member and the third primary support member, and the third lubrication film region is connected between the first lubrication film region and the second lubrication film region; and the third lubrication film region can be elastically stretched and contracted in a direction that points from the first lubrication film region to the second lubrication film region.

10. The rotating shaft apparatus according to claim 1, further comprising:

a third primary support member, located on a side that is of the first primary support member and that is away from the second primary support member, wherein the third primary support member has a third support surface, the third support surface is configured to support a part of the foldable screen, and the third primary support member can also rotate relative to the first primary support member between the unfolded location and the folded location, wherein the first cantilever part further comprises a fifth cantilever segment, wherein the fifth cantilever segment is located on a side that is of the first cantilever segment and that is away from the first connection part, and the fifth cantilever segment is located on a side facing the third support surface; and the lubrication structure is further disposed between the fifth cantilever segment and the third primary support member.

11. The rotating shaft apparatus according to claim 1, wherein the lubrication structure comprises a fourth lubrication layer; and the fourth lubrication layer is disposed on the first support surface.

12. The rotating shaft apparatus according to claim 1, wherein the first secondary support member is in a sheet shape, and when the second primary support member is in an unfolded state relative to the first primary support member, the first secondary support member is stacked with the first support surface and the second support surface; and a thickness of the first secondary support member is greater than or equal to 0.02 mm and less than or equal to 0.1 mm.

13. The rotating shaft apparatus according to claim 1, wherein a material of the lubrication structure is a compound comprising a fluorine element.

14. The rotating shaft apparatus according to claim 1, wherein a material of the lubrication structure is polytetrafluoroethylene or polyoxymethylene.

15. A rotating shaft apparatus, comprising:

a first primary support member, having a first support surface, wherein the first support surface is configured to support a part of a foldable screen;

a second primary support member, having a second support surface, wherein the second support surface is configured to support a part of the foldable screen, and the second primary support member can rotate relative to the first primary support member between an unfolded location and a folded location;

a first secondary support member, comprising a first connection part and a first cantilever part that are fixedly connected, wherein the first connection part is located on a side facing the first support surface and is connected to the first primary support member, the first cantilever part comprises a first cantilever segment, the first cantilever segment is located on a side facing the second support surface, and when the second primary support member rotates relative to the first primary support member between the unfolded location and the folded location, at least a part of the first cantilever segment slides relative to the second primary support member; and a lubrication structure, disposed at least between the at least a part of the first cantilever segment and the second primary support member.

16. The rotating shaft apparatus according to claim 15, wherein there is a first gap between the first primary support member and the second primary support member; and the first cantilever part further comprises a second cantilever segment, and the second cantilever segment is located on a side that is of the first gap and that faces the foldable screen; and the lubrication structure is further disposed between the second cantilever segment and the first gap.

17. The rotating shaft apparatus according to claim 15, further comprising:

a third primary support member, located on a side that is of the first primary support member and that is away from the second primary support member, wherein the third primary support member has a third support surface, the third support surface is configured to support a part of the foldable screen, and the third primary support member can also rotate relative to the first primary support member between the unfolded location and the folded location; and a second secondary support member, comprising a second connection part and a second cantilever part that are fixedly connected, wherein the second connection part is located on the side facing the first support surface and is connected to the first primary support member, the second cantilever part comprises a third cantilever segment, the third cantilever segment is located on a side facing the third support surface, and when the third primary support member rotates relative to the first primary support member between the unfolded location and the folded location, at least a part of the third cantilever segment slides relative to the third primary support member, wherein the lubrication structure is further disposed at least between the at least a part of the third cantilever segment and the third primary support member.

18. The rotating shaft apparatus according to claim 17, wherein there is a second gap between the first primary support member and the third primary support member;

the second cantilever part further comprises a fourth cantilever segment, and the fourth cantilever segment is located on a side that is of the second gap and that faces the foldable screen; and the lubrication structure is further disposed between the fourth cantilever segment and the second gap.

19. A foldable-screen device, comprising:

a foldable screen, a first housing, a second housing and a rotating shaft apparatus;

the rotating shaft apparatus is connected between the first housing and the second housing;

the foldable screen comprises a first display region, a second display region, and a third display region, the third display region is connected between the first display region and the second display region, the first display region is disposed on the first housing, the second display region is disposed on the second housing, and the third display region is disposed on the rotating shaft apparatus;

the rotating shaft apparatus comprises a first primary support member, a second primary support member, a first secondary support member and a lubrication structure;

the first primary support member has a first support surface, wherein the first support surface is configured to support a part of the foldable screen;

the second primary support member has a second support surface, wherein the second support surface is configured to support a part of the foldable screen, and the second primary support member can rotate relative to the first primary support member between an unfolded location and a folded location;

the first secondary support member comprises a first connection part and a first cantilever part that are fixedly connected, wherein the first connection part is located on a side facing the second support surface and is connected to the second primary support member, the first cantilever part comprises a first cantilever segment, the first cantilever segment is located on a side facing the first support surface, and when the second primary support member rotates relative to the first primary support member between the unfolded location and the folded location, at least a part of the first cantilever segment slides relative to the first primary support member; and the lubrication structure is disposed at least between the at least a part of the first cantilever segment and the first primary support member.

20. The foldable-screen device according to claim 19, wherein the lubrication structure comprises a first lubrication layer; and the first lubrication layer is disposed on a surface that is of the at least a part of the first cantilever segment and that faces the first primary support member.

* * * * *